(12) United States Patent
Mitani

(10) Patent No.: US 8,759,951 B2
(45) Date of Patent: Jun. 24, 2014

(54) METHOD FOR MANUFACTURING SEMICONDUCTOR DEVICE, AND SEMICONDUCTOR DEVICE

(75) Inventor: Masahiro Mitani, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 16 days.

(21) Appl. No.: 13/514,104

(22) PCT Filed: Oct. 18, 2010

(86) PCT No.: PCT/JP2010/068291
§ 371 (c)(1),
(2), (4) Date: Jun. 6, 2012

(87) PCT Pub. No.: WO2011/070855
PCT Pub. Date: Jun. 16, 2011

(65) Prior Publication Data
US 2012/0241919 A1   Sep. 27, 2012

(30) Foreign Application Priority Data

Dec. 11, 2009   (JP) ................................. 2009-282189

(51) Int. Cl.
*H01L 27/12* (2006.01)
*H01L 21/26* (2006.01)

(52) U.S. Cl.
CPC .................. *H01L 27/12* (2013.01); *H01L 21/26* (2013.01)
USPC .................... 257/623; 257/E21.347; 438/463; 438/464

(58) Field of Classification Search
CPC ............................... H01L 21/26; H01L 27/12
USPC ........... 257/623, E21.347; 438/463, 464, 517
See application file for complete search history.

(56) References Cited

U.S. PATENT DOCUMENTS

| 5,374,564 | A | 12/1994 | Bruel |
| 6,559,905 | B1 * | 5/2003 | Akiyama ........................ 349/45 |
| 6,887,650 | B2 * | 5/2005 | Shimoda et al. .............. 430/311 |
| 6,933,210 | B2 * | 8/2005 | Inoue ............................. 438/455 |
| 6,972,204 | B2 * | 12/2005 | Oohata et al. .................. 438/22 |
| 7,052,978 | B2 * | 5/2006 | Shaheen et al. ............... 438/463 |

(Continued)

FOREIGN PATENT DOCUMENTS

| JP | 11-142878 A | 5/1999 |
| JP | 3048201 B2 | 6/2000 |

(Continued)

OTHER PUBLICATIONS

Official Communication issued in International Patent Application No. PCT/JP2010/068291, mailed on Jan. 11, 2011.

(Continued)

*Primary Examiner* — Allan R Wilson
(74) *Attorney, Agent, or Firm* — Keating & Bennett, LLP

(57) ABSTRACT

The present invention provides a method for selectively transferring elements such as monocrystalline Si thin films or elements made of monocrystalline Si from a base substrate (100) onto an insulating substrate without the use of an intermediate substrate. The base substrate (first substrate) (100) in which the elements are formed is selectively irradiated with a laser having a multiphoton absorption wavelength. Thus, elements to be transferred out of the elements and corresponding thin films on the base substrate (100) are transferred onto a transfer destination substrate (second substrate) (200).

1 Claim, 14 Drawing Sheets

(56) References Cited

U.S. PATENT DOCUMENTS

| | | | |
|---|---|---|---|
| 2003/0022403 A1* | 1/2003 | Shimoda et al. | 438/14 |
| 2003/0087476 A1* | 5/2003 | Oohata et al. | 438/108 |
| 2003/0162463 A1 | 8/2003 | Hayashi et al. | |
| 2004/0002199 A1 | 1/2004 | Fukuyo et al. | |
| 2004/0241934 A1* | 12/2004 | Inoue | 438/222 |
| 2005/0227455 A1* | 10/2005 | Park et al. | 438/458 |
| 2006/0055864 A1 | 3/2006 | Matsumura et al. | |
| 2006/0148212 A1* | 7/2006 | Fukuyo et al. | 438/463 |
| 2007/0128747 A1* | 6/2007 | Tamura et al. | 438/22 |

FOREIGN PATENT DOCUMENTS

| | | | |
|---|---|---|---|
| JP | 3406207 | B2 | 5/2003 |
| JP | 3408805 | B2 | 5/2003 |
| JP | 3447619 | B2 | 9/2003 |
| JP | 3474187 | B1 | 12/2003 |
| JP | 2006-032435 | A | 2/2006 |
| JP | 2006-041430 | A | 2/2006 |
| JP | 2006-053171 | A | 2/2006 |
| JP | 3994681 | B2 | 10/2007 |
| JP | 2009-064831 | A | 3/2009 |

OTHER PUBLICATIONS

"The Stealth Dicing Technologies and Their Applications", TLAS9004J01, Mar. 2005, 16 pages, Published by Hamamatsu.

"Stealth Dicing Technical Information for MEMS", TLAS9005J02, May 2009, 32 pages, Published by Hamamatsu.

* cited by examiner

METHOD FOR MANUFACTURING SEMICONDUCTOR DEVICE, AND SEMICONDUCTOR DEVICE

TECHNICAL FIELD

The present invention relates to a method for manufacturing a semiconductor device, especially to a method for transferring monocrystalline thin films or semiconductor elements made of monocrystal onto an insulating substrate so that the monocrystalline thin films or the semiconductor elements are distributed on the insulating substrate.

BACKGROUND ART

Currently, production of a super-high-performance low-cost display requires both of (i) TFT (Thin Film Transistor) performance equivalent to that attained with the use of monocrystalline silicon and (ii) a reduction in manufacturing cost. According to conventional TFT processes such as a process using amorphous silicon (hereinafter referred to as "a-Si") and a process using polycrystalline silicon (hereinafter referred to as "poly-Si"), a TFT having desired performance cannot be obtained. In addition, since such conventional TFT processes require huge devices such as a vacuum device, a laser crystallization device, and an exposure device, it is difficult to reduce a manufacturing cost.

For example, (a) of FIG. 13 illustrates a case where circuit elements such as pixels are formed on a large-area glass substrate by a conventional TFT process (an a-Si process or a poly-Si process) for a large-sized liquid crystal display device. This method necessitates forming an a-Si film or the like onto an entire surface of the glass substrate and crystallizing the entire surface of the substrate with the use of a laser. Accordingly, as the size of mother glass increases (size of tenth generation mother glass: 3.1 m×2.9 m), a huge device and enormous investment are required. It is therefore difficult to reduce a manufacturing cost. Moreover, according to this method, only TFTs which largely vary from each other in performance and which require a large amount of power can be obtained.

In view of this, methods were developed in which a super-high-performance low-cost display is produced by (i) forming elements on a small-area substrate and then (ii) causing the elements thus formed to be mounted on a large-area glass substrate so that the elements are distributed in an array. For example, (b) of FIG. 13 illustrates an example of a method in which (i) silicon devices or circuit elements are formed on a silicon substrate (hereinafter referred to as "Si substrate") by an existing IC (Integrated Circuit) process, (ii) the silicon substrate on which the silicon devices or the circuit elements are formed is divided into chips, and (iii) the chips are transferred (or bonded) onto a large-area glass substrate. The transfer may be performed by a Smart Cut process (hydrogen ion separation process) or may be performed by bonding using die bonding.

Transfer of elements using the Smart Cut process is disclosed, for example, in Patent Literatures 1 and 2 invented by the inventors of the present invention. This method is effective in a case where the substrate is divided into approximately tens to hundreds of chips (each having a size of several millimeters) as in a case of a driver of a panel. However, dividing the substrate into millions of elements (each having a size of tens of micrometers) and bonding the elements as in the case of pixel TFTs is impractical not only in terms of throughput but also in terms of handling.

(c) of FIG. 13 illustrates a case where a Si substrate or silicon devices (elements) that are formed on a Si substrate (Si wafer) by the Smart Cut process are bonded to a large-area glass substrate without dividing the Si substrate into chips. According to this method, it is unnecessary to divide the Si substrate into a plurality of chips unlike the case of (b) of FIG. 13. However, according to this method, the silicon devices are separated from the Si substrate by thermal treatment after the silicon devices are bonded to the glass substrate. Accordingly, all of the elements on the Si substrate are transferred onto the glass substrate. Consequently, the silicon devices cannot be transferred while securing a wide spacing, such as pixel pitch, between the silicon devices. In order to transfer elements while securing a wide spacing between the elements, it is necessary to form the elements on a silicon substrate so that the elements are disposed away from each other as illustrated in (d) of FIG. 13. However, this causes a large decline in use efficiency of the silicon substrate.

Further, according to conventional techniques, it is very difficult to transfer high-performance silicon devices or circuit elements formed on a silicon substrate by a single transfer process so that the silicon devices or the circuit elements are distributed. For example, according to the Smart Cut process, which can be used to transfer monocrystalline silicon devices, the whole substrate is heated. Accordingly, it is difficult to selectively transfer only desired monocrystalline silicon devices.

Meanwhile, as a method for selectively distributing elements in order to reduce a manufacturing cost, methods such as the methods disclosed in Patent Literatures 3 and 4 are known. According to the methods disclosed in Patent Literatures 3 and 4, minute elements formed on a small substrate are transferred onto a large-area substrate so that the elements are distributed on the large-area substrate. The following describes an example of how the elements are transferred with reference to FIG. 14.

First, a release layer 12 is formed on a first substrate (base substrate) 11, and a plurality of elements 13 are formed on the release layer 12 (see (a) of FIG. 14). Then, for example, after the elements 13 are bonded to an intermediate substrate 15 coated with a UV release adhesive 14, the first substrate 11 and the intermediate substrate 15 are detached from each other along the release layer so as to transfer all of the elements (first transfer process) (see (b) and (c) of FIG. 14). The detachment is carried out by a method such as a liftoff method using wet etching and an etch stopper layer or a laser abbration of irradiating the release layer with a laser from a rear surface of the first substrate 11. In the case of irradiating the release layer with a laser from the rear surface of the first substrate 11, the first substrate 11 need to be a transparent substrate. Next, the transparent intermediate substrate 15 on which the elements 13 are retained (see (c) of FIG. 14) is bonded to a final substrate (transfer destination substrate) 17 coated with an adhesive 16 (see (d) of FIG. 14). Then, the UV release adhesive 14 is selectively irradiated (irradiated at fixed spacing which corresponds to a pixel pitch) with UV light from a rear surface of the intermediate substrate 15 so as to weaken adhesion of the UV release adhesive 14 (see (e) of FIG. 14). Thereafter, the intermediate substrate 15 and the final substrate 17 are detached from each other, so as to transfer only desired elements 13 onto the final substrate 17 (second transfer process) (see (f) of FIG. 14). Also in a case where the UV release adhesive 14 is irradiated with UV light from the rear surface of the intermediate substrate 15 so as to perform the second transfer process, the intermediate substrate 15 need to be a transparent substrate.

CITATION LIST

Patent Literature 1

Japanese Patent Application Publication, Tokukai, No. 2006-032435 A (Publication Date: Feb. 2, 2006)

Patent Literature 2

Japanese Patent Application Publication, Tokukai, No. 2006-053171 A (Publication Date: Feb. 23, 2006)

Patent Literature 3

Publication of Japanese Patent No. 3447619 (Publication Date: Jan. 12, 2001)

Patent Literature 4

Publication of Japanese Patent No. 3994681 (Publication Date: Oct. 25, 2002)

Patent Literature 5

Publication of Japanese Patent No. 3048201 (Publication Date: Aug. 20, 1993)

Patent Literature 6

Publication of Japanese Patent No. 3408805 (Publication Date: Jul. 10, 2002)

Patent Literature 7

Publication of Japanese Patent No. 3406207 (Publication Date: May 28, 1999)

Patent Literature 8

Publication of Japanese Patent No. 3474187 (Publication Date: Sep. 19, 2003)

Non-Patent Literature 1

"The Stealth Dicing Technologies and Their Applications", TLAS9004E01, published in March, 2005

Non-Patent Literature 2

"Stealth Dicing Technical Information for Mems", TLAS9005E02, published in May, 2009

SUMMARY OF INVENTION

Technical Problem

However, elements that can be transferred by the above method are not monocrystalline silicon devices but are limited to elements which can be formed on a transparent base substrate such as (i) low-performance TFTs made of a-Si or poly-Si which can be formed on a transparent base substrate by a method such as CVD (Chemical Vapor Deposition) or (ii) LEDs made of GaN which can be easily peeled off from a sapphire substrate at an interface therebetween with the use of a laser. That is, according to the above method, monocrystalline silicon elements or the like formed on a non-transparent silicon substrate which does not transmit light cannot be transferred.

Moreover, elements formed on the base substrate 11 cannot be directly transferred onto the transfer destination substrate 17 so that the elements are distributed on the transfer destination substrate 17. That is, in order to transfer elements so that the elements are distributed, it is necessary to (i) once bond the elements to the transparent intermediate substrate 15 coated with a UV release adhesive or the like, (ii) separate the elements from the first substrate 11 by a lift-off method or laser irradiation from the rear surface of the first substrate 11 so as to transfer the elements onto the intermediate substrate 15, and (iii) carry out selective irradiation of UV light or the like from the rear surface of the intermediate substrate 15 so as to transfer the elements formed on the intermediate substrate 15 onto the transfer destination substrate 17 so that the elements are distributed on the transfer destination substrate 17.

As described above, according to the conventional technique, at least two transfer processes are required in order to causes the elements to be distributed. This causes the following problems. Specifically, the repetition of the transfer process is likely to cause the elements to be transferred onto incorrect positions. This causes a decline in transfer accuracy, thereby causing a decline in yield in subsequent contact hole formation and wire formation. As a result, cost increases. Moreover, a manufacturing process becomes longer. As a result, cost increases.

The present invention was attained in view of the above conventional problems, and an object of the present invention is to provide (i) a semiconductor device manufacturing method which allows, by a single transfer process, objects to be transferred, such as semiconductor thin films or semiconductor elements, to be transferred from a base substrate onto a transfer destination substrate so that the objects to be transferred are distributed on the transfer destination substrate, thereby achieving highly accurate transfer, shortening of a manufacturing process, and a reduction in cost (ii) a semiconductor device manufactured by the manufacturing method.

Solution to Problem

In order to attain the above object, a method of the present invention for manufacturing a semiconductor device includes the steps of: forming a first substrate by forming an island pattern of a plurality of elements disposed on a base substrate; bonding the first substrate and a second substrate that is different from the first substrate via some of the plurality of elements; and irradiating regions in which said some of the plurality of elements are provided with a laser having a wavelength that causes multiphoton absorption so as to separate said some of the plurality of elements from the first substrate and selectively transfer said some of the plurality of elements onto the second substrate.

According to the method, predetermined regions of the base substrate are irradiated with a laser having a wavelength which causes multiphoton absorption so that the elements to be transferred are separated from the base substrate. According to this method, even in a case where the base substrate is a Si substrate which does not transmit UV light, the laser passes through a surface of the base substrate and is focused inside the base substrate. This allows a multiphoton absorption phenomenon to occur. The multiphoton absorption phenomenon allows a modified region (modified layer) in which a crystal structure etc. is modified to be formed inside the base substrate. Since a crack or break occurs in the modified region due to the change in crystal structure etc., said some of the plurality of elements can be easily detached from the base substrate. Accordingly the first substrate and the second substrate which are bonded to each other via said some of the plurality of elements can be easily detached from each other.

In this way, said some of the plurality of elements, which are objects to be transferred, can be directly transferred onto the second substrate, which serves as a transfer destination substrate, without the use of an intermediate substrate. Further, since the predetermined regions of the base substrate can be selectively irradiated with the laser, only desired elements can be directly transferred onto the transfer destination substrate. Accordingly, semiconductor elements or the like can be transferred by a single transfer process.

Since the elements to be transferred can be directly transferred from the base substrate (first substrate) onto the transfer destination substrate (second substrate) by a single transfer process, highly accurate transfer with little misalignment can be achieved. This improves yield and shortens a manufacturing process, thereby allowing a reduction in cost. In addition, processing capability (takt time) of the manufacturing process can be improved.

In order to attain the above object, a semiconductor device of the present invention includes: an insulating substrate; and elements provided on the insulating substrate, the insulating substrate having projections provided at predetermined intervals, the elements being formed directly on the projections by transferring the elements onto the insulating substrate in such a manner that top surfaces of the elements are in contact with the projections and rear surfaces of the elements face away from the projections.

The top surfaces of the elements are surfaces which are not in contact with the base substrate and which face upwards before the elements are transferred onto the insulating substrate, and the rear surfaces of the elements are surfaces which are in contact with the base substrate before the elements are transferred onto the insulating substrate.

Since the semiconductor device having such a configuration is manufactured by the above manufacturing method of the present invention, high performance can be maintained even in a case where semiconductor device is constituted by the minute elements. Further, since no intermediate substrate is needed in the manufacturing process, there are advantages of high throughput and low manufacturing cost. Note that the projections are also referred to as islands or an island pattern.

Advantageous Effects of Invention

According to the present invention, a modified region is formed inside a base substrate by multiphoton absorption with the use of a laser having a multiphoton absorption wavelength which laser passes through a silicon surface and is focused inside the silicon substrate. This allows elements such as monocrystalline thin films or elements made of monocrystals to be selectively transferred directly from a non-transparent base substrate onto a large-area transfer destination substrate, although such transfer was difficult according to conventional techniques. Since the elements to be transferred can be directly transferred from the base substrate onto the transfer destination substrate by a single transfer process, highly accurate transfer with little misalignment can be achieved. This shortens a manufacturing process, thereby allowing a reduction in cost.

Figure 13:
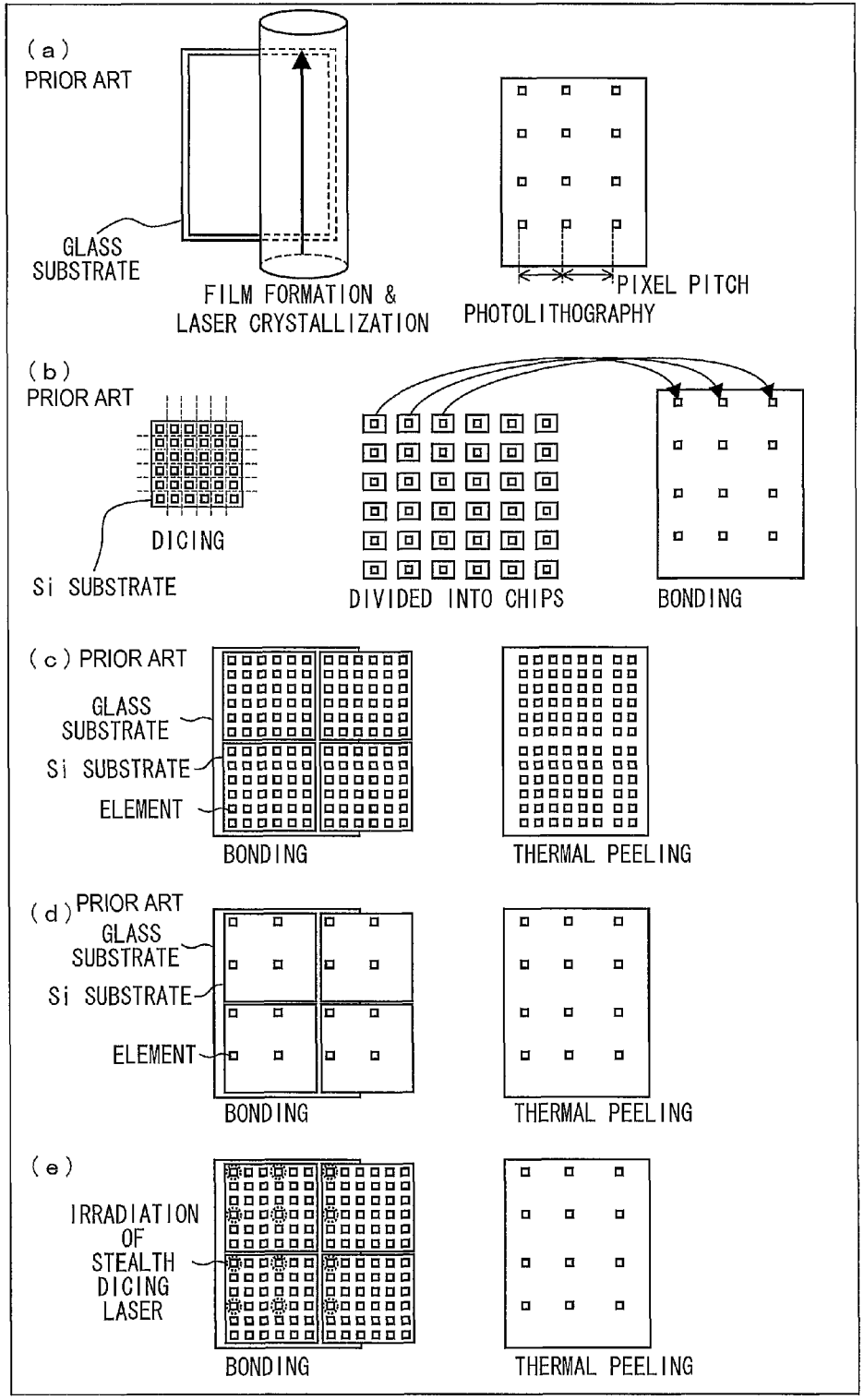

(a) through (d) of FIG. 13 are diagrams illustrating how semiconductor elements are transferred onto a large-area glass substrate according to a conventional technique. (e) of FIG. 13 is a diagram illustrating how semiconductor elements are transferred onto a large-area glass substrate according to the present invention.

Figure 14:
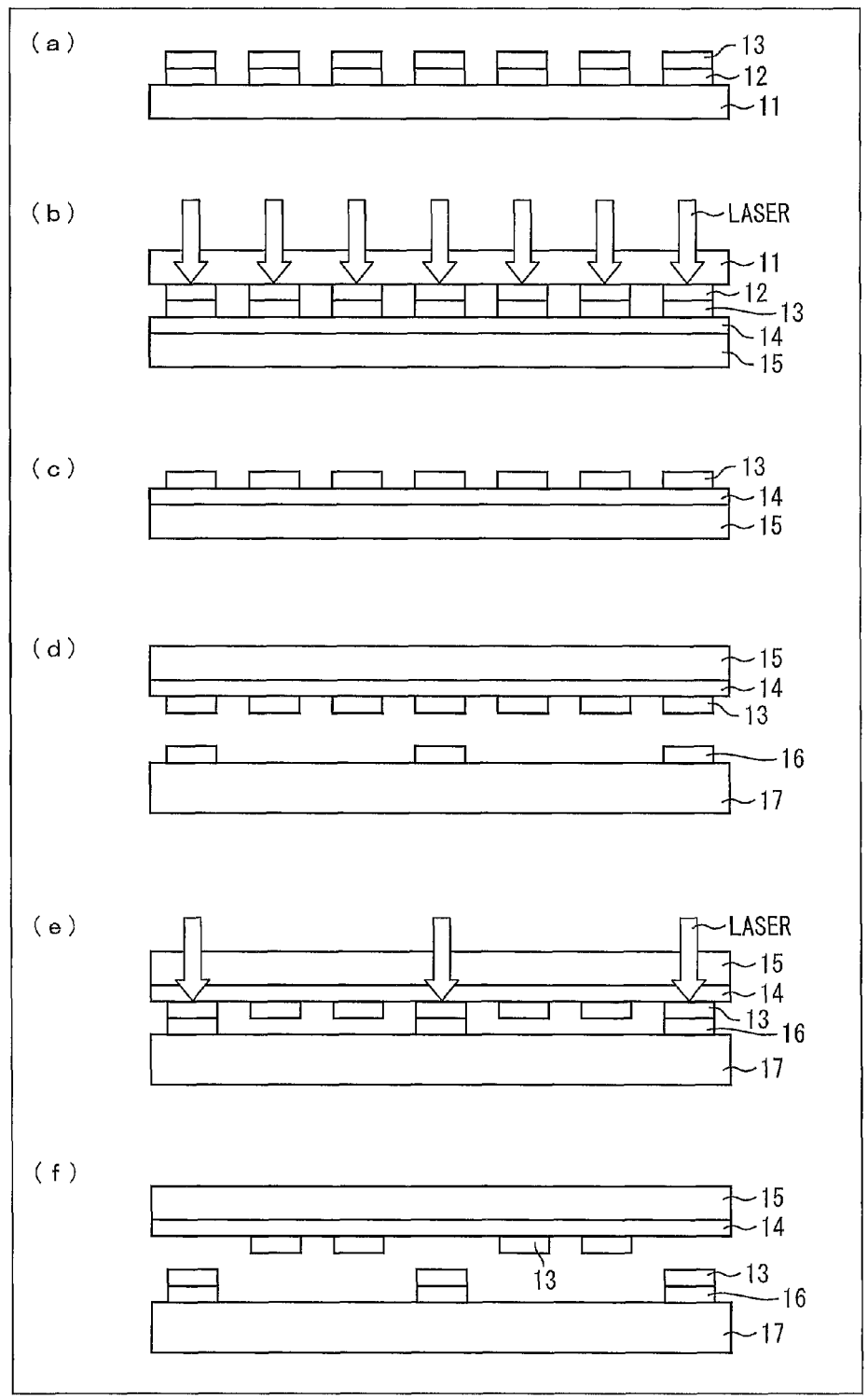

FIG. 14 is a cross-sectional view illustrating a flow for transferring thin films from a base substrate onto a transfer destination substrate via an intermediate substrate according to a conventional technique.

DESCRIPTION OF EMBODIMENTS

Embodiments of the present invention are described below in detail with reference to the drawings. Of course, the present invention is not limited to the embodiments. Note that dimensions, materials, shapes, relative positions, etc. of the constituent members described in Embodiments of the present invention are merely illustrative examples, and the scope of the invention should not be narrowly interpreted within limits of such examples. Note also that constituent members that have identical arrangements through Embodiments of the present invention are given identical names and reference numerals.

The method of the present invention for manufacturing a semiconductor device is a combination of an element bonding technique using the Smart Cut process and a stealth dicing technology using a laser which passes through a surface of a base substrate and is focused inside the base substrate, i.e., has a wavelength causing multiphoton absorption. The laser (stealth dicing laser) used in the stealth dicing technology passes through a surface of a non-transparent substrate such as a Si substrate, is focused inside the substrate, and forms a modified layer inside the substrate. As such, the stealth dicing laser is originally used to scan a Si substrate in a net-like manner so as to divide the Si substrate into small elements in a cross-sectional direction. In the present invention, desired elements are selectively irradiated in a plane direction with the laser from a rear surface of a substrate so as to selectively detach the elements from the Si substrate in the plane direction. This makes it possible to selectively transfer only desired elements out of elements formed on a base substrate onto a large-area transfer destination substrate without the use of an intermediate substrate (see (e) of FIG. 13).

Note that the stealth dicing technology is described in Patent Literature 6, Non-Patent Literatures 1 and 2, etc.

The base substrate is a substrate on which semiconductor elements are formed first, and the transfer destination substrate is a substrate onto which the semiconductor elements formed on the base substrate are to be transferred. The base substrate on which the semiconductor elements are formed is referred to also as a first substrate, and the transfer destination substrate is referred to also as a second substrate. Further, the transfer destination substrate is referred to also as a final substrate since it is a substrate which will form a final product.

In the present invention, examples of the base substrate encompass a Si substrate, SOI (Silicon On Insulator) substrate, a sapphire substrate, GaN substrate, GaAs substrate, and the like. Examples of the transfer destination substrate encompass insulating substrates such as a glass substrate, a plastic substrate, and a film bonded to a supporting substrate.

Examples of the elements formed on the base substrate encompass semiconductor thin films (single layer), semiconductor elements, and the like. Examples of the semiconductor elements encompass light-emitting elements, liquid crystal control elements, photoelectric conversion elements, piezoelectric elements, thin-film transistor elements, thin-film diode elements, resistive elements, switching elements, micro magnetic elements, micro optical elements, and the like.

The following embodiments discuss an example in which (i) the base substrate is a non-transparent Si substrate, (ii) the transfer destination substrate is a glass substrate, and (iii) the elements are monocrystalline Si thin films or semiconductor elements made of monocrystalline Si.

[Method for Transferring Monocrystalline Si Thin Films]

First through Fourth Embodiments below describe a method, in a production process of a semiconductor device, for transferring monocrystalline Si thin films formed on a Si substrate (base substrate) onto a large-area glass substrate (transfer destination substrate) so that the monocrystalline Si thin films are distributed on the glass substrate (transfer destination substrate).

First Embodiment

Figure 1:
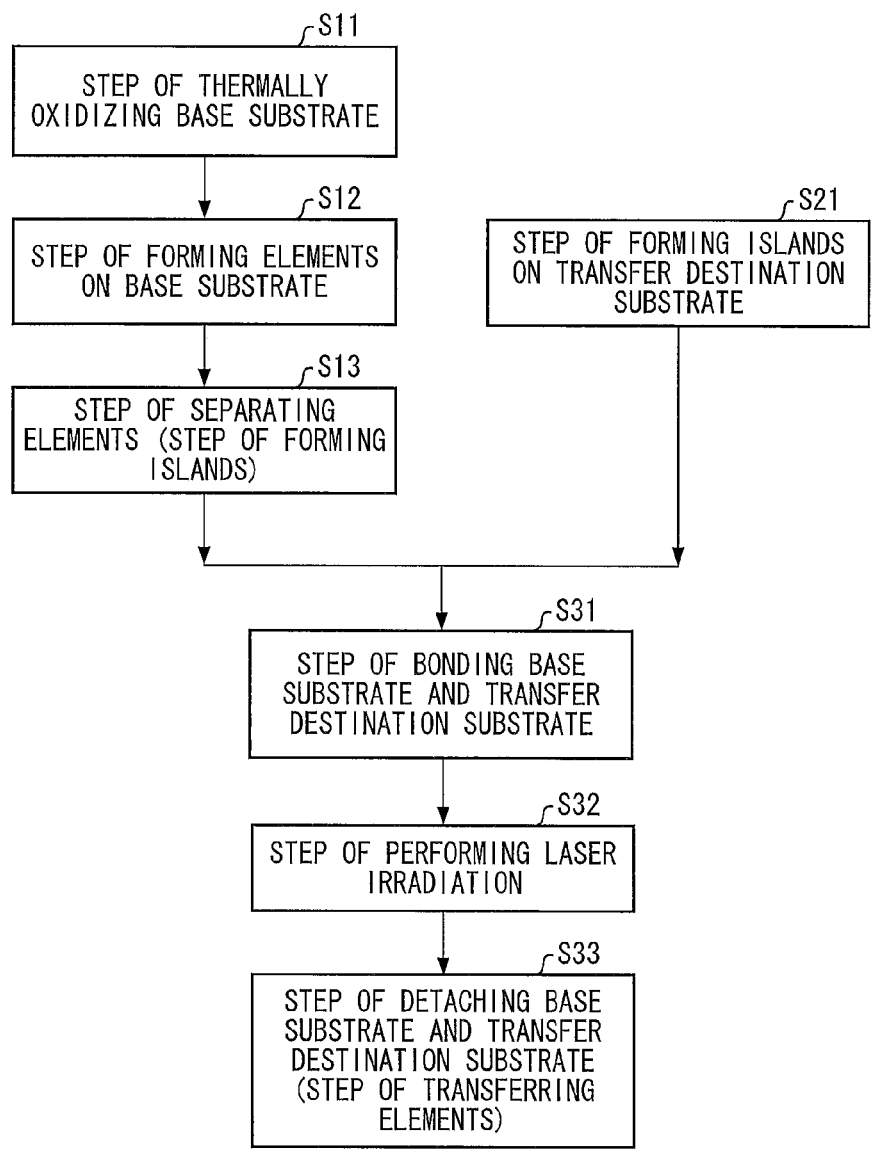
FIG. 1 is a flow chart showing main steps for manufacturing a semiconductor device of the present invention.
Figure 2:
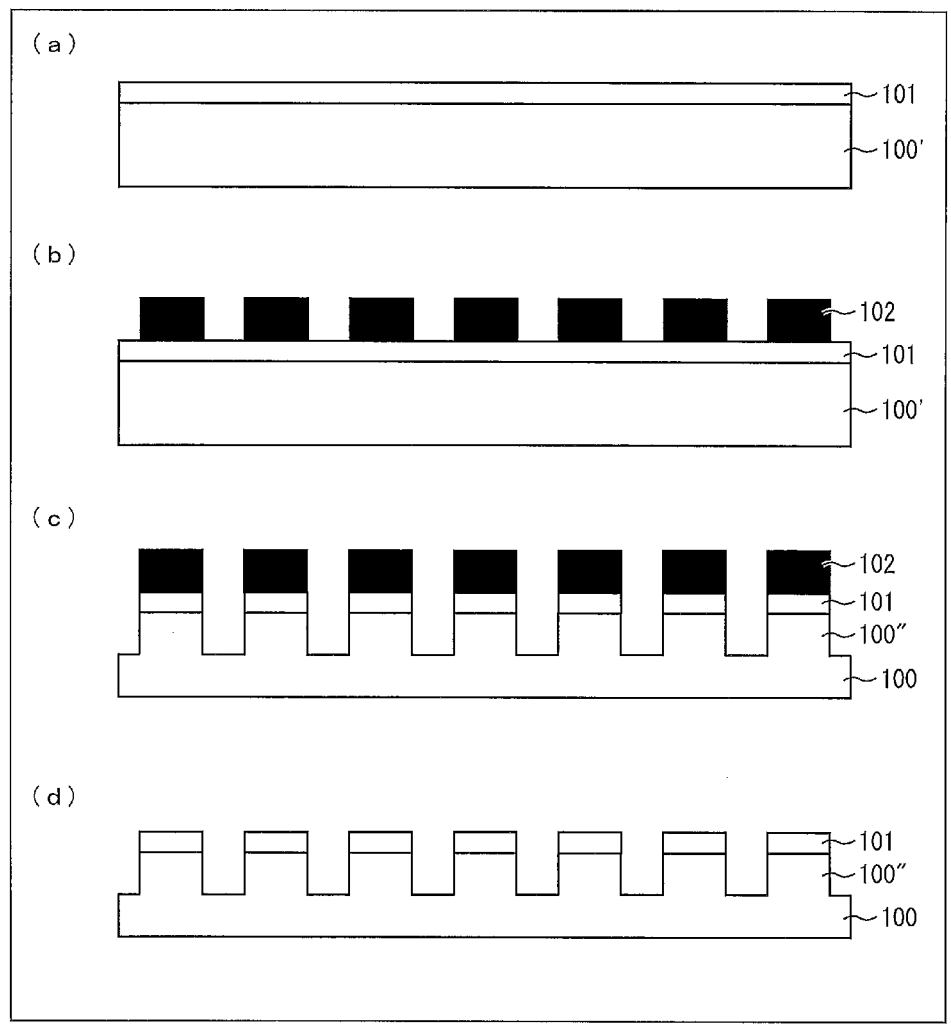
FIG. 2 is a cross-sectional view illustrating a flow for producing a base substrate according to First Embodiment of the present invention.
Figure 3:
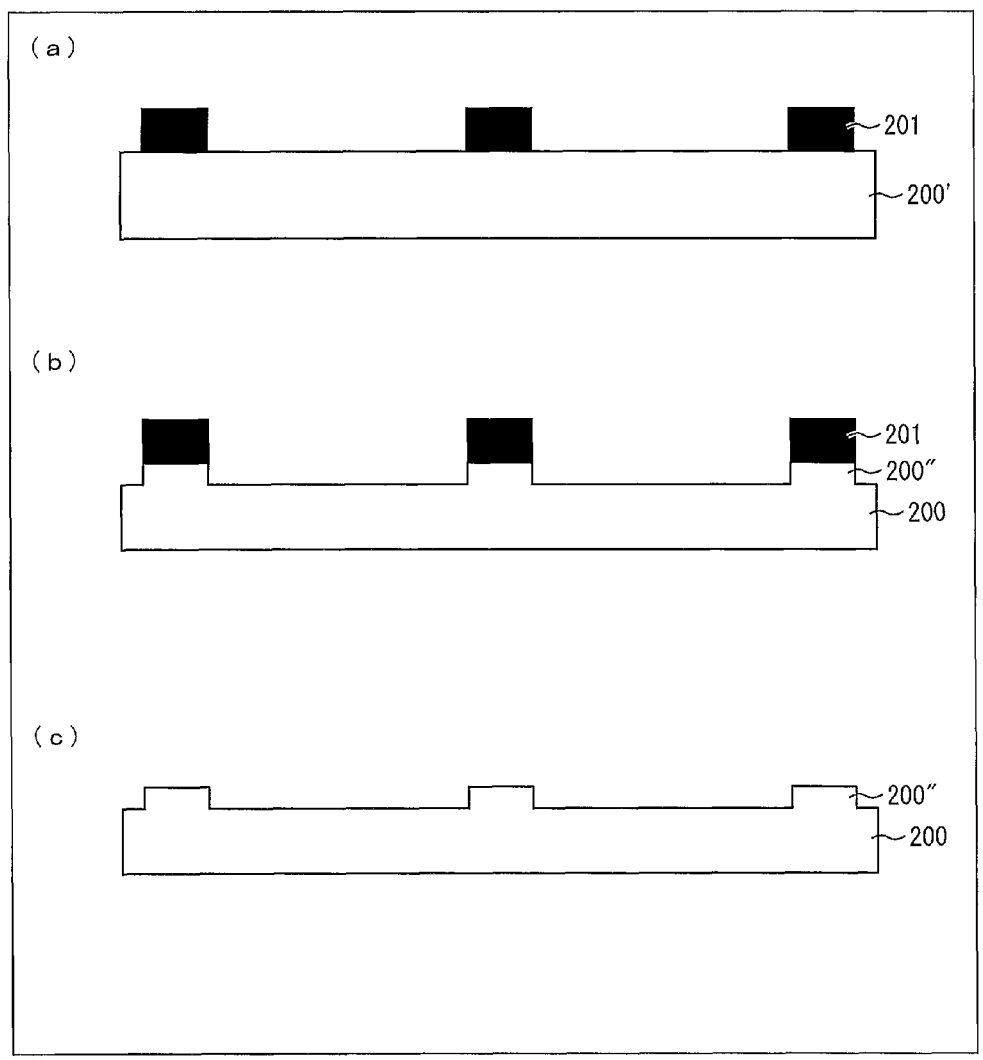
FIG. 3 is a cross-sectional view illustrating a flow for producing a transfer destination substrate according to the embodiment of the present invention.
Figure 4:
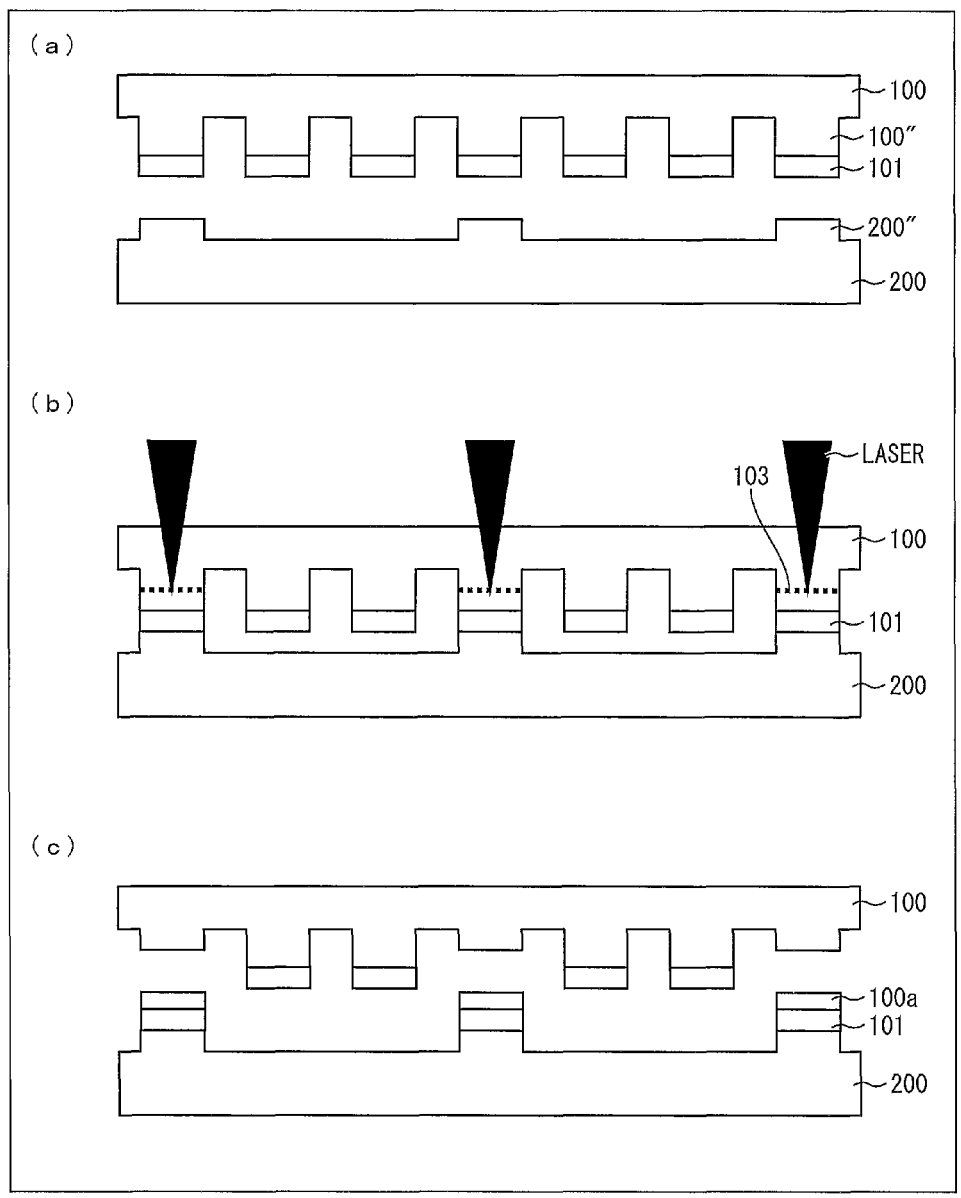
FIG. 4 is a cross-sectional view illustrating a flow for transferring semiconductor elements from the base substrate onto the transfer destination substrate according to the embodiment of the present invention.

First Embodiment of the present invention is described below with reference to FIGS. 1 through 4. FIG. 1 is a flow chart showing main steps of the method of the present invention for manufacturing a semiconductor device. FIG. 2 is a cross-sectional view illustrating main steps of a method for forming a base substrate. FIG. 3 is a cross-sectional view illustrating main steps of a method for forming a transfer destination substrate. FIG. 4 is a cross-sectional view illustrating main steps of a method for transferring desired thin films from the base substrate onto the transfer destination substrate.

First, the steps for forming a Si substrate 100 is described with reference to FIG. 2.

As illustrated in (a) of FIG. 2, a plate-like Si substrate 100' is thermally oxidized so as to form a thermally-oxidized film 101 having a thickness of approximately 50 nm to 100 nm on a surface of the Si substrate 100' (S11 of FIG. 1, thermal oxidation step). In the present embodiment, the thermal oxidation is performed for approximately 1 to 3 hours at a temperature ranging from 900° C. to 1000° C. by using a general vertical or horizontal furnace. Note that in a case where the base substrate is a substrate other than a Si substrate, an oxidized film may be formed by a method such as a CVD method.

Subsequently, as illustrated in (b) of FIG. 2, a resist pattern 102 constituted by single-film-islands each having a predetermined size is formed by photolithography so as to be in close contact with the substrate. Thereafter, as illustrated in (c) of FIG. 2, islands (projections) 100" are formed on the Si substrate 100 by etching the thermally-oxidized film 101 and etching the Si substrate 100 to a predetermined depth. That is, the Si substrate 100' is shaped into islands arranged in a matrix. Note that the etching is carried out by dry-etching using a general fluorine-based gas or a chlorine-based gas. For example, dry-etching of Si is carried out with the use of a combination of (i) a fluorine-based gas such as $CF_4$, $SF_6$, or $NF_3$ or a chlorine-based gas such as $Cl_2$, HCl or $BCl_3$ (ii) and a gas such as Ar or $O_2$. Dry-etching of $SiO_2$ is carried out with the use of a combination of gasses such as $CF_4$, $CHF_3$, $C_2F_6$, $H_2$, $O_2$, and Ar. Note that wet etching using an etchant of HF, BHF, mixture of fluorine and nitric acid, KOH, SLA, or the like may be used instead of dry-etching.

The islands 100" thus formed from the Si substrate become monocrystalline Si thin films (semiconductor elements) 100a on a transfer destination substrate 200 which are obtained in a later step (S12 of FIG. 1, element formation step).

In a case where elements to be transferred are monocrystalline Si thin films, the element formation step and thin film element separation can be accomplished simultaneously by shaping the Si substrate 100' into islands (S13 of FIG. 1, element separation step). Next, as illustrated in (d) of FIG. 2, the resist pattern 102 is striped off by ashing and cleaning, thereby obtaining the Si substrate 100 serving as the base substrate. Note that the Si substrate after the element separation (after the island formation) is referred to as "Si substrate 100" in order to distinguish the initial plate-like Si substrate 100' and the Si substrate which is obtained by carrying out the above steps (e.g., S11 through S13 of FIG. 1) with respect to the Si substrate 100'.

A rear surface of the Si substrate 100 may be polished into a mirror surface with CMP prior to the thermally-oxidized film formation step or after the resist pattern stripping step so that laser light is not scattered by concavities and convexities of the rear surface of the Si substrate 100 in a laser irradiation step (later described), although this step is not illustrated. Note that the rear surface of the Si substrate 100 is a surface opposite to a surface on which the thermally-oxidized film 101 is formed.

Next, the following describes steps for forming a glass substrate (insulating substrate) 200 with reference to FIG. 3.

First, as illustrated in (a) of FIG. 3, a resist pattern 201 constituted by islands (projections) spaced at predetermined intervals is formed on a plate-like glass substrate 200' by photolithography (resist pattern formation step). Islands 200"

formed on the glass substrate 200' are preferably slightly larger than the islands 100" formed on the Si substrate 100 as illustrated in FIG. 2. The islands 200" are spaced away from each other in advance so that the spacing between the islands 200" corresponds to a pixel pitch. A pitch of the islands 200" is preferably an integer multiple of a pitch of the islands 100" formed on the Si substrate 100. That is, it is preferable that the resist pattern 201 be formed so as to meet these conditions.

Subsequently, as illustrated in (b) of FIG. 3, the glass substrate 200' is etched by using the resist pattern 201 as a mask, so as to form the islands 200" arranged in a matrix (S21 of FIG. 1, island formation step). The etching may be carried out by dry-etching using a combination of gasses such as $CF_4$, $CHF_3$, $C_2F_6$, $H_2$, $O_2$, and Ar or may be carried out by wet etching using HF, BHF, or the like. In the case of etching using BHF, the glass substrate 200' can be etched to the depth of approximately 1 µm to 2 µm by approximately 10 to 20-minute etching.

In this way, element separation is accomplished. Thus, as illustrated in (c) of FIG. 3, the glass substrate 200 which serves as the transfer destination substrate on which the semiconductor elements formed on the Si substrate 100 as illustrated in FIG. 2 can be transferred. Note that the glass substrate after the element separation is referred to as "glass substrate 200" in order to distinguish the initial plate-like glass substrate 200' and the glass substrate which is obtained by carrying out the above steps (e.g., S2 of FIG. 1) with respect to the glass substrate 200'.

Next, the following describes steps for transferring the thin films (monocrystalline Si thin films) with the use of the Si substrate 100 and the glass substrate 200 with reference to FIG. 4.

First, the Si substrate 100 and the glass substrate 200 which are obtained through the above steps are subjected to a surface treatment step and a bonding step (S31 of FIG. 1). The surface treatment can be carried out by using a general Smart Cut process. Specifically, surfaces of the two substrates are made hydrophilic by plasma treatment or chemical solution treatment. The plasma treatment may be carried out with the use of plasma such as Ar plasma or atmospheric pressure plasma. Alternatively, the surfaces of the two substrates may be made hydrophilic by carrying out chemical solution treatment such as ozone water cleaning or SC-1 cleaning (mixture solution of hydrogen peroxide solution and ammonia water) for several minutes.

The two substrates that have been subjected to the surface treatment are attached to each other in a manner such that they face each other. This causes the two substrates to be bonded to each other via intermolecular force (van der Waals' force). Thereafter, the two substrates thus bonded to each other are subjected to pre-annealing for approximately two hours at a temperature of 200° C. This promotes dehydration reaction and formation of covalent bonds, thereby strengthening the bonding between the two substrates. Note that, as is clear from (a) and (b) of FIG. 4, out of the plurality of thermally-oxidized films 101 on the Si substrate 100 which have been separated as a result of the element separation, only thermally-oxidized films 101 corresponding to the receiving islands 200" formed on the glass substrate 200 are bonded.

Subsequently, as illustrated in (b) of FIG. 4, only islands 100" to be transferred of the Si substrate 100 bonded to the glass substrate 200 are selectively irradiated with a laser having a wavelength that causes multiphoton absorption from the rear surface of the Si substrate 100 (S32 of FIG. 1, laser irradiation step). The laser light is focused inside the Si substrate 100, thereby forming a modified layer (modified region) 103. The modified region is, for example, (i) a crack region in which a crack is formed inside the substrate due to thermal strain induced by an optical damage caused by multiphoton absorption, (ii) a melting-treated region in which a phase change or a change in crystal structure occurs due to local heating caused by multiphoton absorption (for example, in a case of monocrystalline silicon, the melting-treated region corresponds to a region in which the monocrystalline silicon has changed to amorphous silicon having crystal structure periodicity disturbed by the local heating), or (iii) a refractive index change region in which a permanent structural change such as a change in valence of ion, crystallization, or polarization orientation is induced inside the substrate. Note that a type of the modified region to be formed can be determined according to which type of substrate is used.

For example, in a case where a semiconductor substrate such as a Si substrate is used as in the present embodiment, a melting-treated region is most preferably formed as the modified region. Meanwhile, in a case where a transparent substrate such as a glass substrate or a sapphire substrate is used, a refractive index change region can be formed as the modified region. Since the modified layer 103 thus formed inside the Si substrate 100 has a region in which a crack has occurred, a region in which a crystal structure has been weakened, or a region in which a structural change such as a change in valence of ion or polarization orientation is induced, the Si substrate 100 can be easily detached from the glass substrate 200 along the modified layer 103 formed inside the Si substrate 100 by pulling the Si substrate 100 and the glass substrate 200 away from each other in opposite directions (S33 of FIG. 1, detachment step).

That is, of the islands 100" divided along the modified layer 103, portions which are bonded to the glass substrate 200 via the thermally-oxidized films 101 are transferred onto the glass substrate 200 as illustrated in (c) of FIG. 4. This obtains the glass substrate 200 onto which the thin films (monocrystalline Si thin films, parts of the base substrate) 100a have been transferred. The glass substrate 200 thus obtained can be used, as a final substrate, in a semiconductor device. The thickness of the monocrystalline Si thin films 100a can be appropriately controlled by adjusting a position at which the laser is focused. If necessary, for example, in a case where the thickness of the monocrystalline Si thin films 100a need to be controlled to such an extent exceeding a range of the laser adjustment, the thickness of the monocrystalline Si thin films 100a may be further reduced by performing etch-back of the monocrystalline Si thin films 100a with the use of a dry-etching device after they are transferred onto the glass substrate 200.

The laser applied from the rear surface of the Si substrate 100 has a wavelength of 1064 nm and is a semiconductor-laser-pumped Nd:YAG laser, which is a laser for stealth dicing. Needless to say, the laser that can be used as a laser light source may be Nd:YVO4 laser, Nd:YLF laser, or titanium-sapphire laser instead of the Nd:YAG laser. The laser irradiation is carried out under the conditions that a peak power density is $1 \times 10^8$ W/cm$^2$ or more and a pulse width is 1 µs or less. More preferably, the laser irradiation is carried out under the conditions that the peak power density is in a range from $1 \times 10^{11}$ W/cm$^2$ to $1 \times 10^{12}$ W/cm$^2$ and the pulse width is in a range from 1 ns to 200 ns.

A type of the laser to be used can be determined according to which type of modified region is to be formed. For example, in a case where a modified layer 103 including a crack region or a melting-treated region is formed, a laser having a peak power density of $1 \times 10^8$ W/cm$^2$ or more and a pulse width of 1 µs or less is preferably used. Specifically, the Nd:YAG laser, the Nd:YVO4 laser or the Nd:YLF laser is preferably used. Meanwhile, in a case where a modified layer 103 including a refractive index change region is used, a laser having a peak power density of $1\times10^8$ W/cm$^2$ or more and a pulse width of 1 ns or less (more preferably 1 µs or less) is preferably used. Specifically, a titanium-sapphire laser is preferably used. Such lasers each have a long wavelength, and therefore pass through even a surface of a substrate which does not transmit UV light and is focused inside the substrate because of a multiphoton absorption phenomenon, thereby forming a modified layer such as a region in which a crack has occurred inside the substrate, a region in which a crystal structure has been weakened inside the substrate, or a region in which a structural change such as a change in valence of ion or polarization orientation is induced inside the substrate.

The laser irradiation is preferably carried out with respect to predetermined regions in which the elements to be transferred are formed while the laser light source is being passed over the substrate surface. Alternatively, the laser irradiation may be carried out by moving a stage on which the substrate is placed while the position of the laser light source is being fixed. This allows the entire predetermined regions, each of which has a peeled area larger than a spot diameter of the laser, to be irradiated with the laser. Accordingly, a modified layer for detachment can be formed in the entire predetermined regions. Thus, the separation along the modified layer can be more surely carried out. The laser irradiation may be carried out by a conventional method.

The laser irradiation may be carried out in a state in which the temperature of the Si substrate 100 is increased to a temperature higher than a room temperature. This is because in a case where the base substrate is a Si substrate, increasing the substrate temperature to 100° C. or more reduces a band gap of Si (1.12 eV at a room temperature) to 1.1 eV or less, thereby allowing more light of the YAG laser (wavelength: 1064 nm, hv=1.16 eV) to be absorbed inside the substrate. Accordingly, multiphoton absorption is more likely to occur. Consequently, a modified region with a weaker Si—Si bond is formed, and the separation along the modified region becomes easier.

Similarly, in a case where the base substrate is a GaAs substrate (band gap at a room temperature: 1.42 eV), the bad gap can be reduced to 1.1 eV or less by increasing the substrate temperature to 700° C. or more.

As described above, in the present embodiment, out of elements arranged in a matrix on the Si substrate 100 which serves as a base substrate (first substrate), only elements to be transferred are irradiated with a stealth dicing laser. This allows the elements to be detached from the base substrate in a plane direction and to be selectively transferred onto the large-area glass 200 which serves as a transfer destination substrate (second substrate). Thus, an island pattern of the elements arranged in a matrix at a pitch that is an integer multiple of a pitch of the elements formed on the base substrate can be formed on the transfer destination substrate (second substrate) (see (e) of FIG. 13).

Second Embodiment

The present embodiment discusses an example in which monocrystalline Si thin films (elements) formed on a Si substrate are directly transferred onto a glass substrate so that the monocrystalline Si thin films are distributed on the glass substrate, as in First Embodiment. Unlike First Embodiment, the present embodiment discusses an example in which a step of forming, in advance inside the base substrate, a fragile layer that is weaker than other parts of the substrate is added in order to make separation along a modified layer formed in the glass substrate easier.

Figure 5:
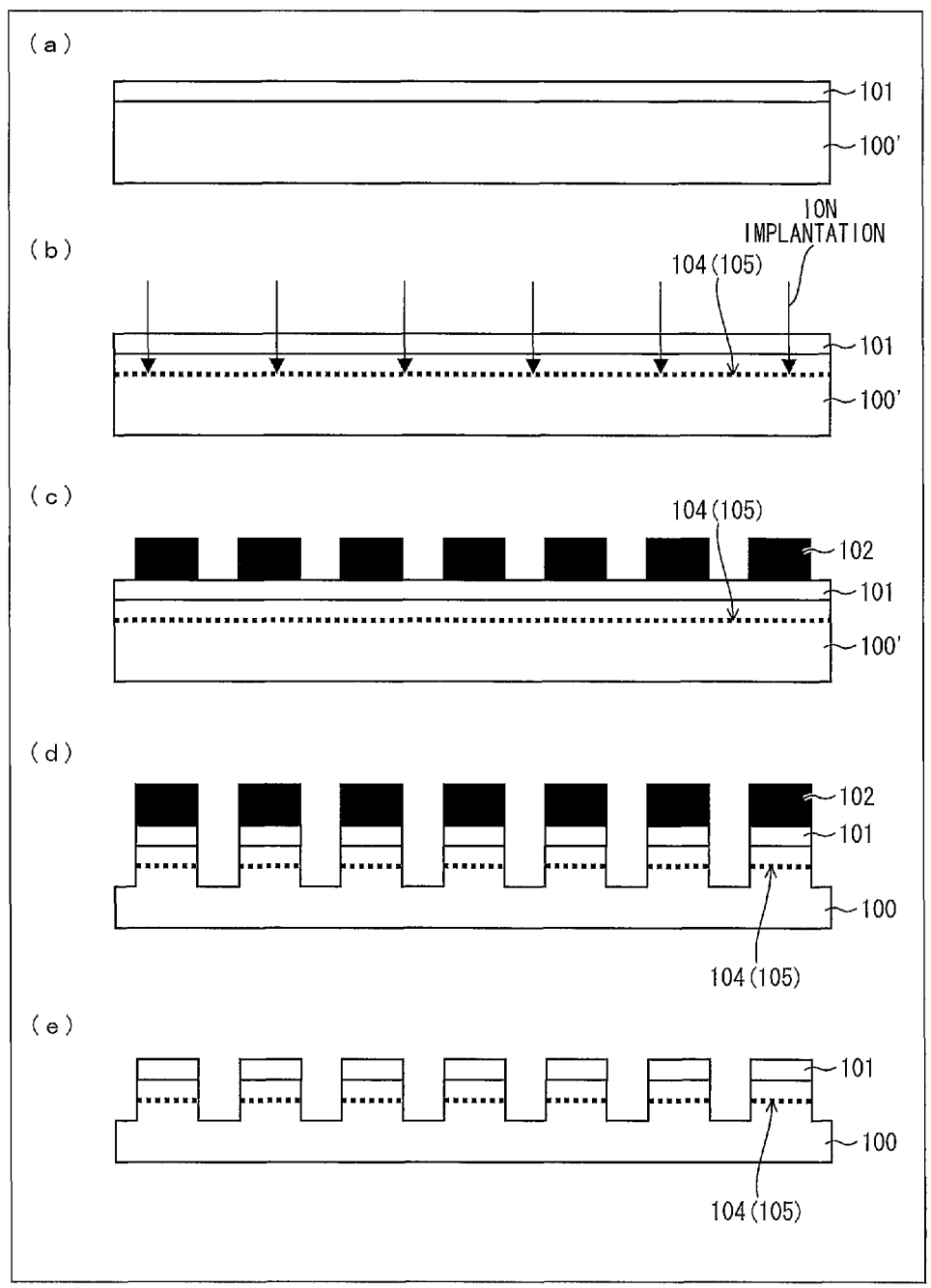
FIG. 5 is a cross-sectional view illustrating a flow for producing a base substrate according to Second and Third Embodiments of the present invention.

FIG. 5 is a cross-sectional view illustrating steps for forming a Si substrate 100 of the present embodiment. Unlike the steps for forming the Si substrate 100 in First Embodiment, the formation process of the Si substrate 100 according to the present embodiment includes a step of forming a fragile layer 104 inside the Si substrate 100 in advance. The steps other than this step are identical to those explained in First Embodiment, and are therefore briefly described.

In the formation process of the Si substrate 100 according to the present embodiment, first, a thermally-oxidized film 101 is formed on a plate-like Si substrate 100' as illustrated in (a) of FIG. 5, and then the fragile layer 104 is formed inside the Si substrate 100' as illustrated in (b) of FIG. 5.

Specifically, a hydrogen ion is implanted into the Si substrate 100' at a predetermine depth inside the Si substrate 100' by hydrogen ion implantation or hydrogen ion doping. For example, in the case of H$^+$ ion implantation, the hydrogen ion implantation is carried out under the conditions that implantation energy is approximately 20 keV to 60 keV and an implantation amount is in a range from $5\times10^{14}$/cm$^2$ to $5\times10^{15}$/cm$^2$. In the case of doping of ions including ions such as H$_3^+$, the hydrogen ion doping is carried out under the conditions that the implantation energy is approximately 20 keV to 60 keV and an implantation amount is in a range from $1\times10^{16}$/cm$^2$ to $5\times10^{16}$/cm$^2$. Since a hydrogen ion is light, the hydrogen ion can penetrate deep into the Si substrate by ion implantation or ion doping. The hydrogen ion thus implanted disturbs a crystal lattice of Si and remains inside. Subsequently, the Si substrate 100' is subjected to annealing at a low temperature of approximately 200° C. to 400° C. This causes a rise in internal pressure in a region in which the hydrogen ion remains. The rise in internal pressure produces minute bubbles (platelet), thereby inducing minute cracks. In this way, a layer into which the hydrogen ion has been implanted or a layer which as been doped with the hydrogen ion becomes the fragile layer 104 inside the Si substrate 100' after thermal annealing. The predetermined depth can be appropriately adjusted by changing the implantation energy in consideration of the thickness of thin films 100a formed in a later step.

Next, the Si substrate 100' is subjected to a resist pattern 102 formation step and an etching step as illustrated in (c) and (d) of FIG. 5. Subsequently, after a resist pattern 102 detachment step, the Si substrate 100 having the fragile layer 104 therein is obtained as illustrated in (e) of FIG. 5.

The glass substrate 200 is formed according to identical steps to those described in First Embodiment (see FIG. 3).

Next, a surface treatment step, a bonding step, and a laser irradiation step for the Si substrate 100 and the glass substrate 200 are also carried out in an identical manner to that described in First Embodiment. Then, a modified layer 103 including a melting-treated region (amorphous silicon with disturbed crystal structure periodicity) is formed inside the Si substrate 100 after the laser irradiation step (see (a) of FIG. 6). This triggers generation of a crack or a break. In this case, since the fragile layer 104 is formed in advance by the hydrogen ion implantation and annealing, the crack or break caused by the laser irradiation can be caused to run along the fragile layer 104. This allows the monocrystalline Si thin films 100a to be easily separated from the Si substrate 100 serving as the base substrate. Then, by pulling the Si substrate 100 and the glass substrate 200 away from each other in opposite directions, the base substrate (the Si substrate 100) and the transfer destination substrate (the glass substrate 200) are easily separated from each other along the modified layer 103 which is formed along the fragile layer 104 so as to peel off easily (see (b) of FIG. 6). This obtains the glass substrate 200 onto which the thin films (monocrystalline Si thin films) 100a have been transferred.

Third Embodiment

The present embodiment discusses an example in which, instead of the fragile layer, a light absorbing layer which absorbs more light than the other parts of the substrate is formed in advance inside the main body of the base substrate in order to make the separation along the modified layer formed inside the Si substrate easier. Steps other than the light absorbing layer formation step are identical to those described in First and Second Embodiments, and are therefore described briefly. Note that the present embodiment is described with reference to identical drawings to those of Second Embodiment.

In the formation process of the Si substrate 100 according to the present embodiment, first, a thermally-oxidized film 101 is formed on a plate-like Si substrate 100' as illustrated in (a) of FIG. 5, and then a light absorbing layer 105 is formed inside the Si substrate 100' as illustrated in (b) of FIG. 5.

Specifically, an ion is implanted into the Si substrate 100' at a predetermined depth inside the Si substrate 100' by ion implantation or ion doping. The ion thus implanted forms a donor level or an acceptor level within a band gap. Thus, the light absorbing layer 105 is formed inside the Si substrate 100'. The predetermined depth can be appropriately adjusted by changing the implantation energy in consideration of the thickness of thin films 100a formed in a later step.

The type of ion to be used can be, for example, boron, phosphorus, arsenic, gallium, indium, titanium, palladium, carbon, silicon, antimony, zinc, tellurium, cadmium, or the like. For example, in the case of ion implantation of boron, the ion implantation or ion doping is carried out under the conditions that the implantation energy is approximately 40 keV to 150 keV and the implantation amount is $1\times10^{15}/cm^2$ or more. In the case of ion implantation of phosphorus, the ion implantation is carried out under the conditions that the implantation energy is approximately 100 keV to 250 keV and the implantation amount is $1\times10^{15}/cm^2$ or more.

Next, the Si substrate 100' is subjected to a resist pattern 102 formation step and an etching step as illustrated in (c) and (d) of FIG. 5. Subsequently, after a resist pattern 102 detachment step, the Si substrate 100 having the light absorbing layer 105 therein is obtained as illustrated in (e) of FIG. 5.

The glass substrate 200 is formed according to identical steps to those described in First Embodiment (see FIG. 3).

Next, a surface treatment step, a bonding step, and a laser (e.g., YAG laser having a wavelength of 1064 nm) irradiation step for the Si substrate 100 and the glass substrate 200 are also carried out in an identical manner to that described in First Embodiment. Then, a modified layer 103 including a melting-treated region (amorphous silicon with disturbed crystal structure periodicity) is formed inside the Si substrate 100 after the laser irradiation step (see (a) of FIG. 6). This triggers generation of a crack or a break. Since the light absorbing layer 105 is formed inside the Si substrate 100, multiphoton absorption is more likely to occur in the light absorbing layer 105 via an acceptor level by the laser irradiation. This forms amorphous silicon with a more disturbed crystal structure periodicity. As a result, the modified layer 103 which peels off easily can be formed.

In this respect, according to a conventional technique (e.g., Patent Literature 6), in a case where (i) a YAG laser having a wavelength of 1064 nm is used as a laser light source and (ii) a Si substrate (thickness: 500 μm or less) having a band gap of 1.12 eV is used as a base substrate, most of the light passes through the base substrate (internal transmittance: approximately 80% or more). In contrast, in a case where the light absorbing layer 105 is formed by implantation of boron as in the present invention, an acceptor level is formed at 0.045 eV above a bottom of a valence band. Accordingly, absorption of the laser light via this acceptor level is more likely to occur only in this layer (the internal transmittance substantially declines). As a result, multiphoton absorption becomes more likely to occur. Note, however, that the ion need to be implanted in high concentration since the density of donors or acceptors are smaller than density of Si.

As described above, in a case where the light absorbing layer 105 is formed in advance by implantation of ion such as boron, more laser light can be absorbed inside the substrate during irradiation of laser light having a multiphoton absorption wavelength from a rear surface of the main body of the base substrate 100. Accordingly, a modified layer having amorphous silicon (melting-treated region) with more disturbed crystal structure periodicity can be formed by the laser light irradiation.

Figure 6:
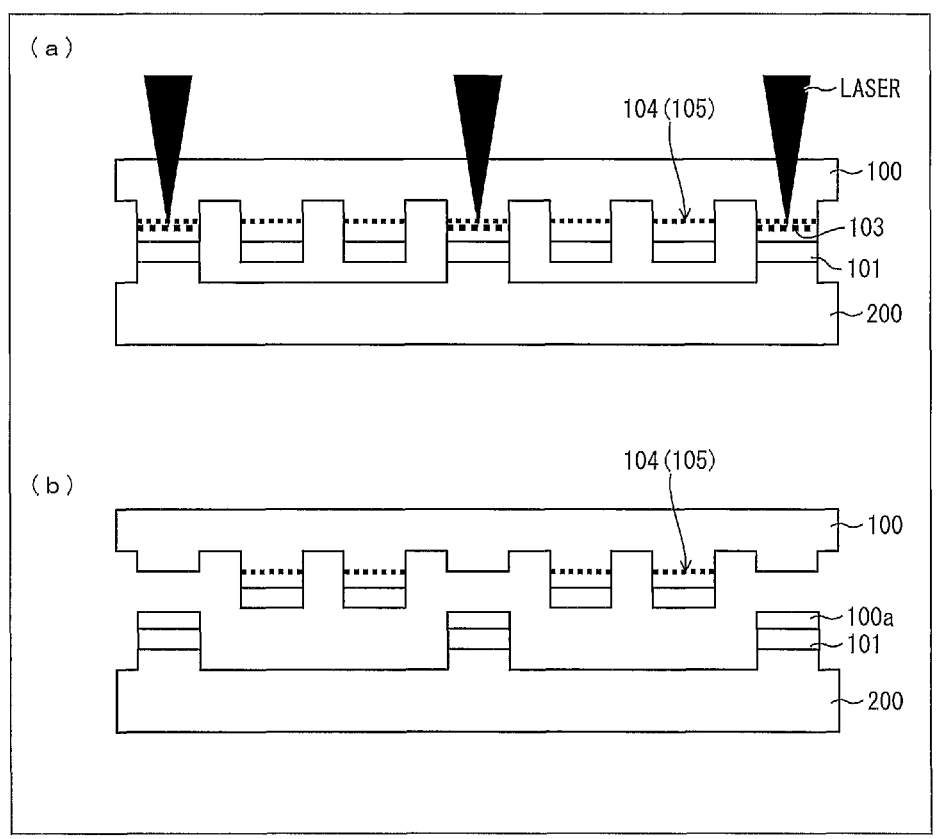
FIG. 6 is a cross-sectional view illustrating a flow for transferring thin films from the base substrate onto the transfer destination substrate according to Second and Third Embodiments of the present invention.

After the above steps, by pulling the Si substrate 100 and the glass substrate 200 away from each other in opposite directions, the Si substrate 100 and the glass substrate 200 are easily separated from each other along the modified layer 103 which is formed so as to peel off easily (see (b) of FIG. 6). This obtains the glass substrate 200 onto which the thin films (monocrystalline Si thin films) 100a have been transferred.

Fourth Embodiment

The present embodiment describes a method for separating a Si substrate and a glass substrate.

First, by any of the methods described in First through Third Embodiment, the Si substrate 100 and the glass substrate 200 are formed, and the modified layer 103 which peels off easily is formed through surface treatment step, bonding step, and laser irradiation step for the Si substrate 100 and the glass substrate 200.

Figure 7:
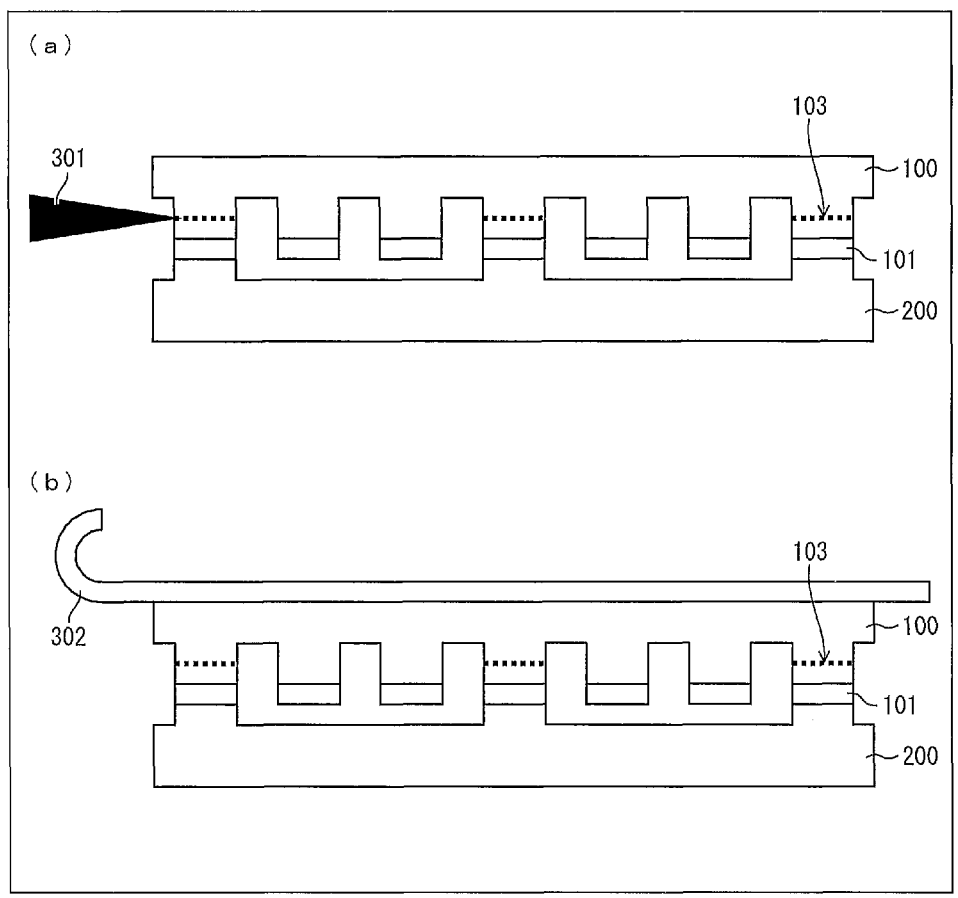
FIG. 7 is a cross-sectional view illustrating a method for detaching the base substrate and the transfer destination substrate from each other according to Fourth Embodiment of the present invention.

Then, in a step of transferring thin films by separating the Si substrate 100 and the glass substrate 200, the two substrates are separated by using a mechanical force or a laminate film stripping method, as illustrated in FIG. 7.

Specifically, a blade 301 with a sharp tip is applied to a side surface of the Si substrate 100 in which the modified layer 103 is formed by the laser irradiation step, as illustrated in (a) of FIG. 7. A crack or a break formed along the modified layer 103 is thus widened by a mechanical force. Thus, the thin films 100a are detached along the modified layer 103.

Alternatively, an adhesive sheet 302 for use in dicing or the like is attached as a laminate film to the rear surface of the Si substrate 100, as illustrated in (b) of FIG. 7. Then, the adhesive sheet 302 and the Si substrate 100 are peeled off together. Thus, the thin films 100a are detached along the modified layer 103.

According to the methods described in First through Fourth Embodiments, elements (monocrystalline Si thin films) formed on a Si substrate (base substrate) can be transferred onto a large-area glass substrate (transfer destination substrate) so that the elements are distributed on the glass substrate. After the above-mentioned steps, a general TFT formation process (photolithography, etching, film formation, etc.) using a large-sized glass substrate such as a poly-Si process can be carried out in any of the methods described in First through Fourth Embodiments. Thus, a TFT backplane having high-performance and low-variation TFTs made of monocrystalline Si can be formed on a glass substrate. The high-performance and low-variation TFT backplane thus obtained can be suitably used not only as backplane of a liquid crystal panel but also as a backplane of an organic EL (OLED) panel or the like.

The following embodiments describe a case where semiconductor elements or parts of respective semiconductor elements are formed in advance on a base substrate and are then transferred onto a transfer destination substrate so as to be distributed on the transfer destination substrate. Note that what is meant by "parts of respective semiconductor elements" is partially-completed semiconductor elements that have not been completely processed yet. That is, the term "parts of respective semiconductor elements" refers to not complete semiconductor elements that have been subjected to all processes up to a final process (multilayer wiring completion step), but partially-completed (unfinished) elements such as elements in which only steps up to a gate electrode formation step or only steps up to a source electrode/drain electrode formation step are carried out. More specifically, this means that semiconductor elements formed on a base substrate may be formed in such a manner that microfabrication processes (especially processes up to microfabrication of a gate electrode) which are difficult to perform on a large-area substrate is performed on a small-area substrate (the base substrate), whereas formation of wires which do not require high processing accuracy is performed on the large-area substrate (transfer destination substrate) after the semiconductor elements are transferred onto the large-area substrate.

[Semiconductor Elements Made of Monocrystalline Si]

The following embodiments describe steps for transferring minute transistors as an example of the elements. As in First through Fourth Embodiments, the following embodiments discuss an example in which the base substrate is a Si substrate and the transfer destination substrate is a glass substrate.

Fifth Embodiment

In the present embodiment, semiconductor elements (minutes transistors) are formed on a base substrate with the use of a general process used in IC manufacturing. Needless to say, the present embodiment merely describes an example of a general IC process, and the present invention is not limited to this.

Figure 8:
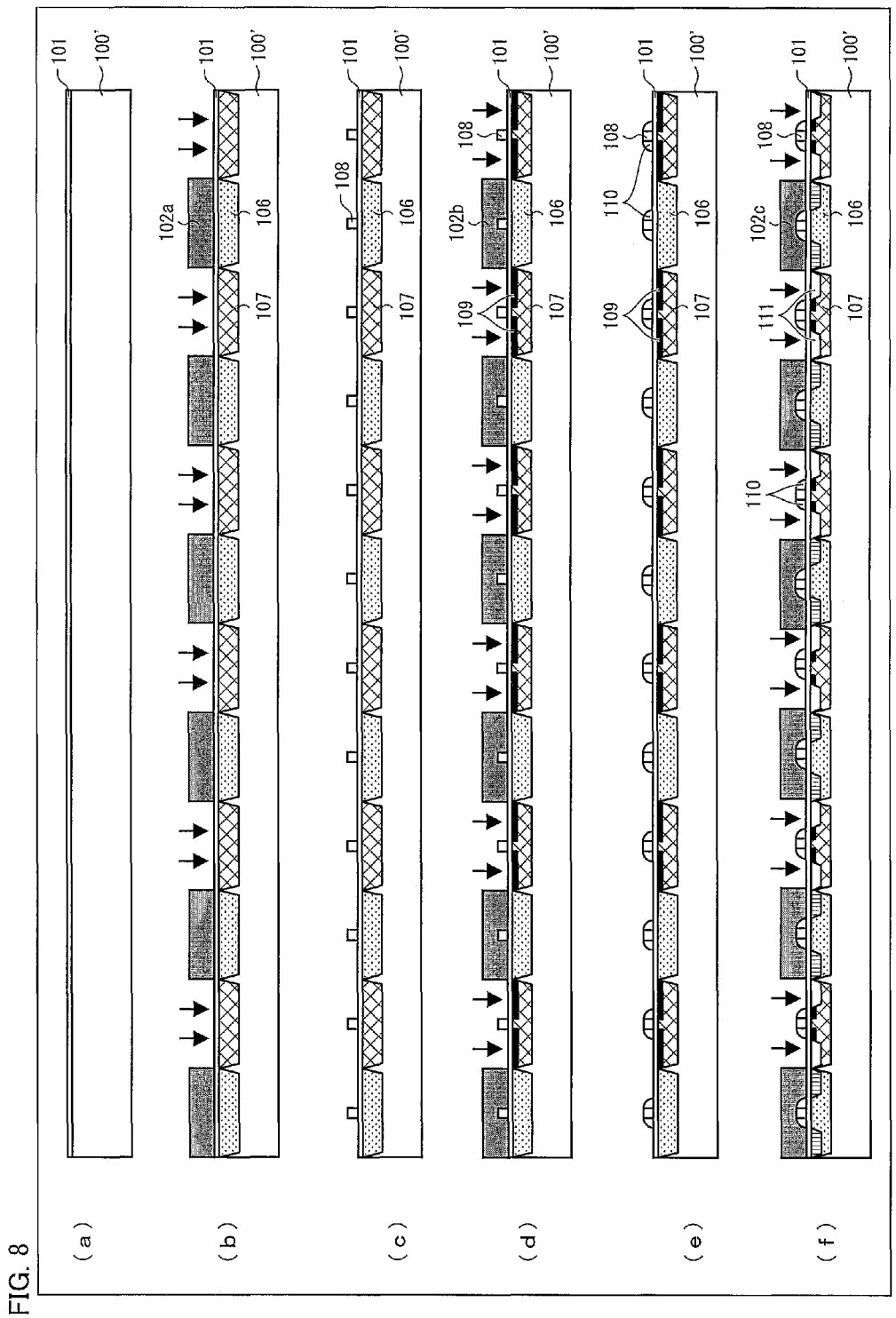
FIG. 8 is a cross-sectional view illustrating a flow for producing a base substrate having semiconductor elements according to Fifth Embodiment of the present invention.
Figure 9:
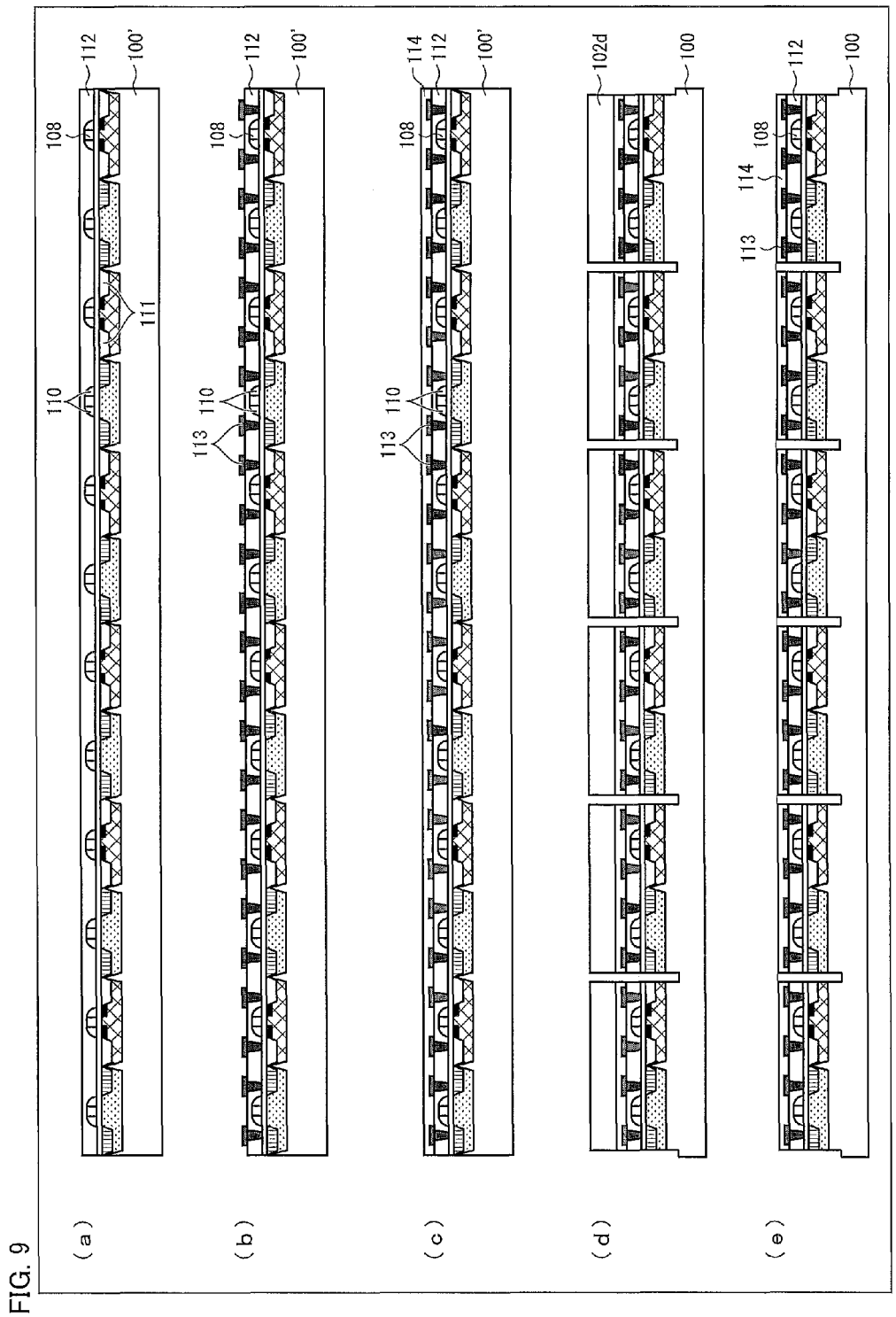
FIG. 9 is a cross-sectional view illustrating a flow, subsequent to the flow of FIG. 8, for producing a base substrate having semiconductor elements according to Fifth Embodiment of the present invention.

FIG. 8 is a cross-sectional view for explaining main steps for forming transistors (elements) on a Si substrate. FIG. 9 is a cross-sectional view for explaining main steps for transferring the semiconductor elements formed on the Si substrate onto a glass substrate.

In the present embodiment, as illustrated in (a) of FIG. 8, a Si substrate 100' is thermally oxidized so as to form a thermally-oxidized film 101 having a thickness of approximately 50 nm to 100 nm on a surface of the Si substrate 100' (thermal oxidation step). The thermal oxidation is carried out for approximately 1 to 3 hours at a temperature from 900° C. to 1000° C. by using a general vertical furnace or horizontal furnace. Note that in a case where the base substrate is a substrate other than a Si substrate, an oxidized film may be formed by a method such as a CVD method.

Subsequently, as illustrated in (b) of FIG. 8, a resist pattern 102a is formed on predetermined regions of the thermally-oxidized film 101 by photolithography, and n-type well regions (hereinafter referred to as "n-wells") 106 into which phosphorus has been implanted and p-type well regions (hereinafter referred to as "p-wells") 107 into which boron has been implanted are formed in the Si substrate 100' (well formation step).

Then, element separation of the n-wells and the p-wells is carried out by using a LOCOS oxidation used in a general IC process although this step is not illustrated. Thereafter, ion is implanted into channel regions of the n-wells and the p-wells by using resist as a mask as necessary in order to adjust a threshold voltage of each of NMOS and PMOS. For example, a boron ion is implanted under the conditions that implantation energy is 10 keV to 40 keV and an implantation amount is approximately $1 \times 10^{12}/cm^2$ to $1 \times 10^{13}/cm^2$.

Subsequently, film formation or sputtering of a gate electrode material is carried out, and then the film is patterned by photolithography. Thus, as illustrated in (c) of FIG. 8, gate electrodes 108 each having a thickness of approximately 200 nm to 400 nm are formed (gate electrode formation step). The gate electrodes 108 may be formed from a film of an n+ Poly gate highly doped with phosphorus or a film of a p+ Poly gate highly doped with boron which film is formed by CVD. Alternatively, the gate electrodes 108 may be formed from a film of a metal such as W, Mo, or MoW which film is formed by sputtering. Etching used to pattern the film may be, for example, dry-etching using a combination of (i) a chlorine-based gas such as $CCl_4$, $BCl_3$, $SiCl_4$, or $Cl_2$ or a fluorine-based gas such as $SF_6$, $CF_4$, or $NF_3$ and (ii) a gas such as Ar or $O_2$.

Subsequently, as illustrated in (d) of FIG. 8, a resist pattern 102b is formed so as to cover gate electrodes 108 provided above the n-wells 106, and phosphorus of low concentration is implanted by using the gate electrodes 108 and the resist pattern 102b as a mask. Thus, LDD regions 109 are formed in the NMOS (LDD region formation step). Specifically, phosphorus is implanted under the conditions that implantation energy is 10 keV to 40 keV and an implantation amount is approximately $1 \times 10^{13}/cm^2$ to $1 \times 10^{14}/cm^2$. Needless to say, the LDD region formation step can be omitted in a case where an LDD structure is not required.

Subsequently, after the resist pattern 102b is peeled off, an insulating film such as a high-temperature oxide film is formed on an entire surface of the Si substrate 100' so as to have a thickness of approximately 200 nm to 600 nm. Then, etch-back is performed. This allows self-aligned side walls 110 to be highly-accurately formed in side portions of the gate electrodes 108 as illustrated in (e) of FIG. 8 (side wall formation step). A length of each of the LDD regions 109 is defined by a width of each of the side walls 110.

Next, a resist pattern 102c is formed so as to cover the gate electrodes 108 and side walls 109 which are provided above the n-wells 106. Then, as illustrated in (f) of FIG. 8, phosphorus of high concentration is implanted by using, as a mask, gate electrodes 108 and side walls 109 which are provided above the p-wells 107 and the resist pattern 102c provided above the n-wells 106. This allows source/drain regions 111 which are n+ regions to be formed on the p-wells 107 (source/drain region formation step). Further, boron of high concentration is implanted by using, as a mask, the gate electrodes 108 and the side walls 109 which are provided above the n-wells 106 and a resist pattern provided above the p-wells 107, although this step is not illustrated. This allows source/drain regions 111 which are p+ regions to be formed on the n-wells 106.

Specifically, phosphorus or arsenic is implanted into the n+ regions under the conditions that the implantation energy is 20 keV to 100 keV and the implantation amount is approximately $1 \times 10^{15}/cm^2$ to $5 \times 10^{15}/cm^2$, so that the source/drain regions 111 which are n+ regions are formed on the p-wells 107. Further, boron or $BF_2$ is implanted into the p+ regions under the conditions that the implantation energy is 20 keV to 100 keV and the implantation amount is approximately $1\times10^{15}/\text{cm}^2$ to $5\times10^{15}/\text{cm}^2$, so that the source/drain regions 111 which are p$^+$ regions are formed on the n-wells 106.

Then, as illustrated in (a) of FIG. 9, an interlayer insulating film 112 is formed on an entire surface of the thermally-oxidized film 101 on the Si substrate 100' by CVD (interlayer insulating film formation step). The interlayer insulating film 112 is a SiNO film having a thickness of approximately 50 nm to 200 nm, a TEOS film having a thickness of approximately 200 nm to 600 nm, or a laminated film of these films. Thereafter, the Si substrate 100' is subjected to activation annealing at a temperature ranging from 800° C. to 900° C. for approximately 1 to 2 hours, so as to activate the impurity ion implanted into the source/drain regions.

Subsequently, photolithography and etching are conducted so as to form contact holes in the interlayer insulating film 112. The etching used to form the contact holes is dry-etching using a gas such as Cl$_2$ or wet-etching using HF or the like.

Then, an Al film, an AlSi film, a Ti film, or a laminated film of these films is formed on an entire surface of the interlayer insulating film 112 by sputtering. The film thus formed on the interlayer insulating film 112 makes contact with the source/drain regions 111 via the contact holes. Thereafter, the film thus formed on the interlayer insulating film 112 is patterned by photolithography. Thus, as illustrated in (b) of FIG. 9, source/drain electrodes 113 each having a thickness of approximately 400 nm are formed (source/drain electrode formation step).

Subsequently, as illustrated in (c) of FIG. 9, an interlayer insulating film 114 is further formed on the entire surface of the interlayer insulating film 112 on the Si substrate 100' by CVD (interlayer insulating film reformation step). The interlayer insulating film 114 is a SiN film having a thickness of approximately 100 nm to 300 nm, a TEOS film having a thickness of approximately 200 nm to 600 nm, a laminated film of these films, or the like. After the SiN film is formed, hydrogen sintering may be performed at a temperature of 450° C. for approximately 30 to 60 minutes.

After the interlayer insulating film 114 is formed, a surface of the interlayer insulating film 114 is polished by CMP so as to be planarized (polishing step). At the same time, a rear surface of the Si substrate 100' may be polished by CMP so that laser light is not scattered in a later laser irradiation step.

Subsequently, a resist pattern 102d is formed on an entire surface of the interlayer insulating film 114, and photolithography and etching are conducted by using the resist pattern 102d as a mask. The etching is performed until the Si substrate 100' is etched to a predetermined depth. This obtains separated transistors as illustrated in (d) of FIG. 9 (element separation step). For the element separation, the following etching method is used. Specifically, dry-etching of Si is carried out with the use of a mixed gas of (i) a fluorine-based gas such as CF$_4$, SF$_6$, or NF$_3$ or a chlorine-based gas such as Cl$_2$, HCl, or BCl$_3$ and (ii) a gas such as Ar or O$_2$. Further, dry-etching of SiO$_2$ and SiN is carried out with the use of a combination of gasses such as CF$_4$, CHF$_3$, C$_2$F$_6$, H$_2$, O$_2$, and Ar. The dry-etching may be combined with a method such as wet-etching using HF, BHF, mixture of fluorine and nitric acid, hot phosphoric acid, or the like.

Subsequently, ashing of the whole Si substrate 100' is carried out, and then the Si substrate 100' is immersed in an organic stripping solution so as to remove the resist pattern 102d. Thus, the surface of the interlayer insulating film 114 is exposed. This obtains a Si base substrate 100 in which minute transistors are formed on the Si substrate 100' as illustrated in (e) of FIG. 9. Note that the Si substrate after the element separation is referred to as the Si substrate 100 in order to distinguish the Si substrate 100' and the Si substrate in which minute transistors are formed on the Si substrate 100'.

Figure 10:
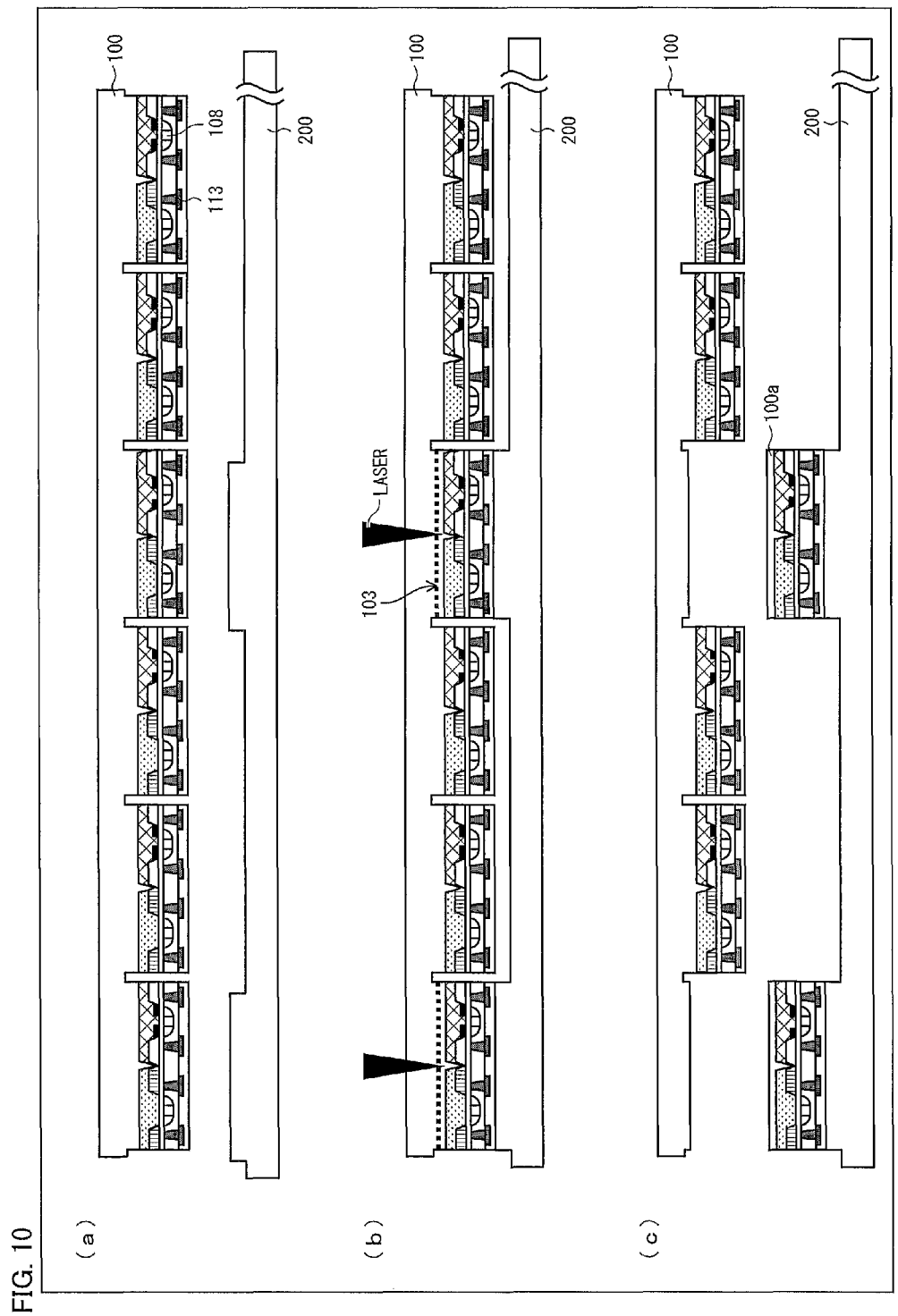
FIG. 10 is a cross-sectional view illustrating a flow for transferring semiconductor elements formed on the base substrate and thin films onto the transfer destination substrate according to Fifth Embodiment of the present invention.

Next, a glass substrate 200 is formed in a similar manner to that described in First through Fourth Embodiments (see FIG. 3). Further, a surface treatment step, a bonding step, and subsequent steps such as a laser irradiation step and a transfer step for the Si substrate 100 and the glass substrate 200 are also carried out in an identical manner to that described in First Embodiment (see FIG. 10). In the above case in which minute transistors are formed as elements, the minute transistors are separated from the Si substrate 100 along a modified layer 103 formed inside the Si substrate 100. Accordingly, thin films (monocrystalline Si thin films, parts of the base substrate) separated from the Si substrate main body are transferred onto the glass substrate 200 along with the transistors. The parts of the base substrate thus transferred may be removed by etch-back using a dry-etching device.

In this way, sub-micron scale minute transistors, which require microfabrication that is difficult to perform on a large-area insulating substrate such as a glass substrate, can be formed on the large-area insulating substrate.

Sixth Embodiment

The present embodiment discusses an example in which, in a case where minute transistors formed on a Si substrate are transferred onto a glass substrate, a step of forming, in advance inside the Si substrate, a fragile layer that is weaker than other parts of the substrate is added in order to make separation along a modified layer easier which is formed inside the Si substrate by laser irradiation.

Figure 11:
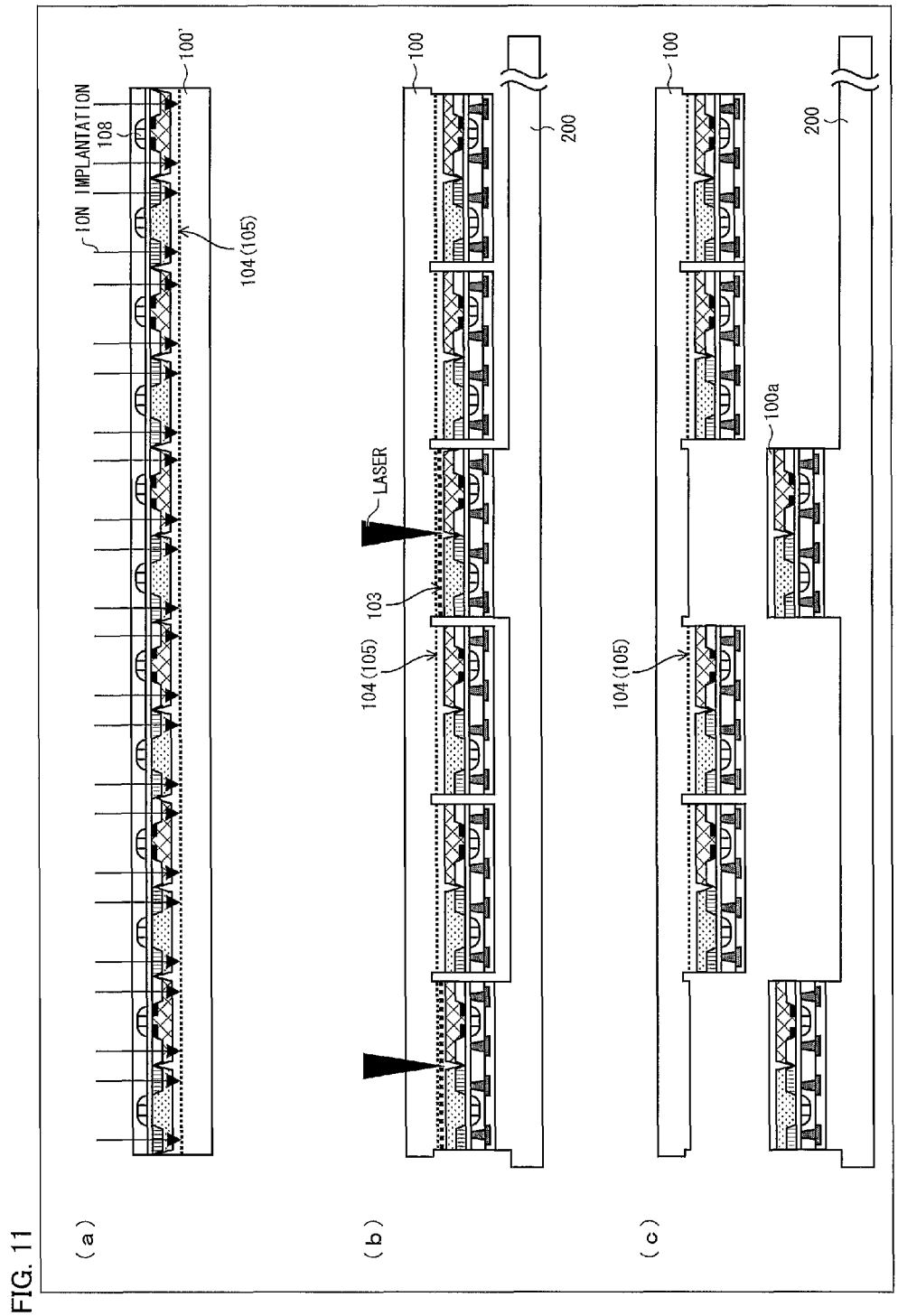
FIG. 11 is a cross-sectional view illustrating part of a flow for producing a base substrate and a flow for transferring semiconductor elements formed on the base substrate and thin films onto the transfer destination substrate according to Sixth and Seventh Embodiments of the present invention.

In the present embodiment, subsequently to the step of forming the interlayer insulating film 112 as shown in (a) of FIG. 9, a surface of the interlayer insulating film 112 is polished by CMP so as to be planarized. Next, as illustrated in (a) of FIG. 11, a hydrogen ion is introduced into the Si substrate 100' at a predetermined depth by ion implantation or doping so as to form a fragile layer 104.

For example, in a case of H$^+$ ions, the hydrogen ion implantation or doping is carried out under the conditions that implantation energy is approximately 150 keV to 250 keV and an implantation amount is $1\times10^{16}/\text{cm}^2$ to $1\times10^{17}/\text{cm}^2$. In a case of implantation of various kinds of hydrogen ions such as H$^+$, H$_2^+$, and H$_3^+$, the hydrogen ion implantation or doping is carried out under the conditions that implantation energy is approximately 150 keV to 250 keV and an implantation amount is $2\times10^{17}/\text{cm}^2$ to $1\times10^{18}/\text{cm}^2$. A hydrogen ion layer created by the implantation or doping becomes the fragile layer 104 inside the Si substrate 100 through subsequent thermal annealing (fragile layer formation step). The predetermined depth can be appropriately adjusted by changing the implantation energy in consideration of the thickness of thin films to be transferred onto the glass substrate in a later step.

The fragile layer formation step may be carried out after the thermally-oxidized film 101 is formed ((a) of FIG. 8) on the Si substrate 100'.

Steps subsequent to the fragile layer formation step are identical to those described in First through Fifth Embodiments. The following briefly describes a step for transferring the minute transistors. As illustrated in (b) of FIG. 11, the Si substrate 100 and the glass substrate 200 that have been bonded to each other are irradiated with a laser having a wavelength which causes multiphoton absorption from a rear surface of the Si substrate 100. This causes a modified layer 103 including a melting-treated region (amorphous silicon with disturbed crystal structure periodicity) to be formed in a region irradiated with the laser inside the Si substrate 100. This triggers generation of a crack or a break. Since the fragile layer 104 is formed in advance by hydrogen ion implantation, the crack or the break runs along the fragile layer 104. Accordingly, the Si substrate 100 is separated along the fragile layer 104, as illustrated in (c) of FIG. 11. As a result, the Si substrate 100 and the glass substrate 200 are detached from each other.

Seventh Embodiment

Unlike Sixth Embodiment, the present embodiment discusses an example in which a light absorbing layer 105 is formed in advance inside the Si substrate 100 instead of the fragile layer 104. The light absorbing layer 105 allows multiphoton absorption to more easily occur by laser irradiation via levels in the light absorbing layer 105. This forms amorphous silicon (melting-treated region) with more disturbed crystal structure periodicity. As a result, a modified layer 103 that easily peels off can be formed.

A step for forming the light absorbing layer 105 is identical to the step for forming the light absorbing layer in Third Embodiment, and therefore is not described in detail.

As described in Sixth Embodiment, the step for forming the light absorbing layer 105 may be carried out after the thermally-oxidized film 101 is formed ((a) of FIG. 8) on the Si substrate 100' or may be carried out after (i) an interlayer insulating film 112 is formed ((a) of FIG. 9) and (ii) a surface of the interlayer insulating film 112 is polished by CMP so as to be planarized.

In a case where ion implantation or ion doping is carried out after the surface of the interlayer insulating film 112 is polished so as to be planarized, it is preferable that the implantation energy be set higher than that of Third Embodiment in order to implant the ion more deeply. For example, in a case where boron is implanted, the implantation is carried out under the conditions that the implantation energy is approximately 150 keV to 300 keV and the implantation amount is $1 \times 10^{15}/cm^2$ or more.

Steps following the light absorbing layer formation step are identical to those described in Sixth Embodiment. Specifically, the Si substrate 100 and the glass substrate 200 that have been bonded to each other are irradiated with a laser having a multiphoton absorption wavelength from a rear surface of the Si substrate 100. This causes a modified layer 103 including a melting-treated region (amorphous silicon with disturbed crystal structure periodicity) to be formed in a region irradiated with the laser inside the Si substrate 100. As a result, a crack or break occurs. Since the light absorbing layer 105 is formed in advance by implantation of an ion such as boron, more laser light can be absorbed. This allows a modified layer 103 including amorphous silicon (melting-treated region) with more disturbed crystal structure periodicity to be formed. Consequently, the Si substrate 100 and the glass substrate 200 can be more easily detached from each other.

Eighth Embodiment

The present embodiment discusses a method for detaching the Si substrate 100 and the glass substrate 200 from each other. Steps other than steps for detaching the Si substrate 100 and the glass substrate 200 from each other are identical to those described in Fifth through Seventh Embodiments. That is, by using any of the methods described in Fifth through Seventh Embodiments, the Si substrate 100 and the glass substrate 200 are formed and a modified layer 103 which easily peels off is formed through a surface treatment step, a bonding step, and a laser irradiation step for the Si substrate 100 and the glass substrate 200.

Figure 12:
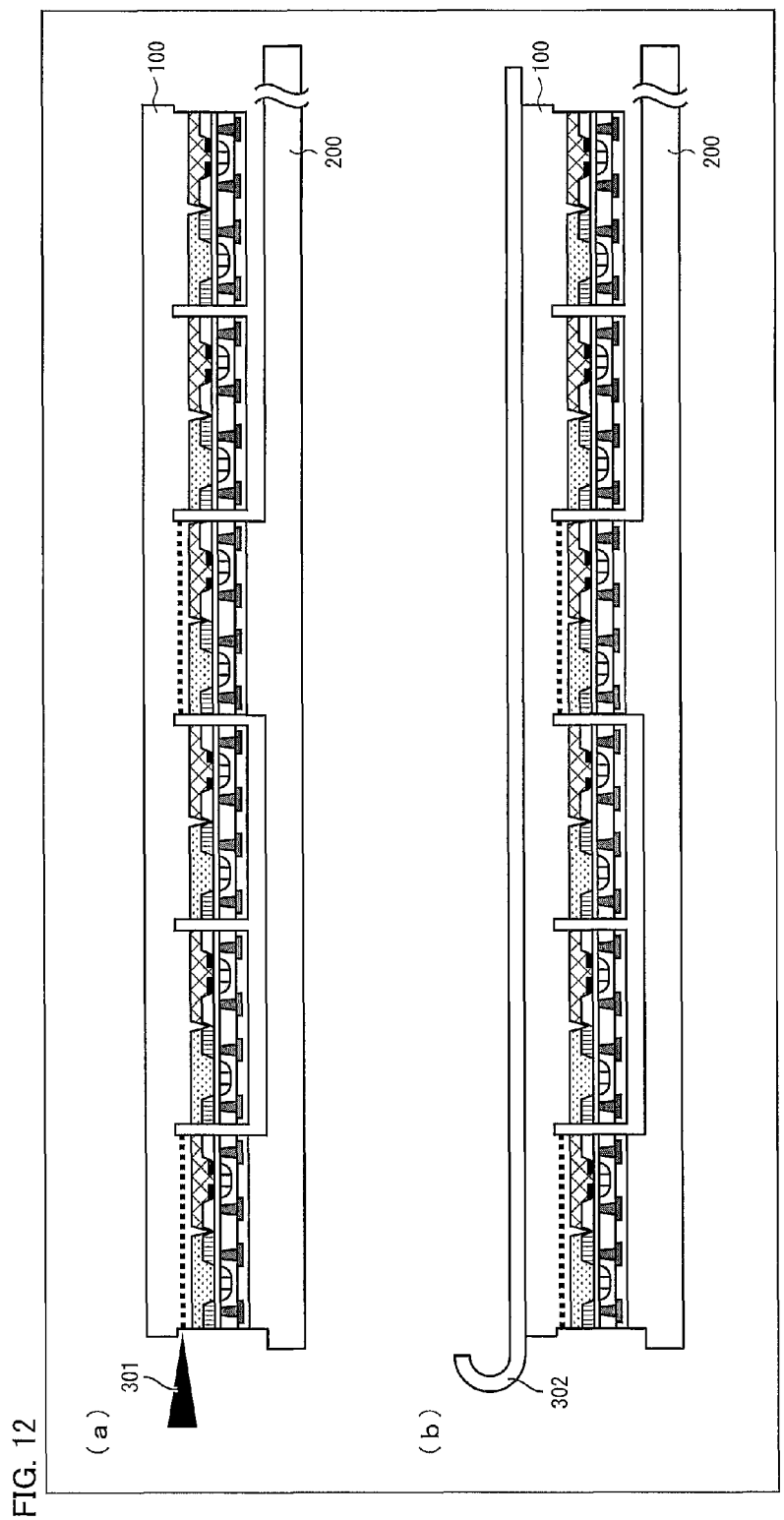
FIG. 12 is a cross-sectional view illustrating a method for detaching the base substrate and the transfer destination substrate according to Eighth Embodiment of the present invention.

In a step of transferring transistors by detaching the Si substrate 100 and the glass substrate 200 from each other, the two substrates are detached from each other by a mechanical force or a laminate film stripping method as illustrated in FIG. 12.

Specifically, as illustrated in (a) of FIG. 12, a blade 301 with a sharp tip is applied to a side surface of the Si substrate 100 in which the modified layer 103 is formed by the laser irradiation step. In this way, a crack or a break formed along the modified layer 103 is widened by a mechanical force, and the transistors formed on the Si substrate 100 are detached from the Si substrate 100 along the modified layer 103 along with thin films made of a Si substrate material.

Alternatively, as illustrated in (b) of FIG. 12, an adhesive sheet 302 for use in dicing or the like is attached as a laminate film to the rear surface of the Si substrate 100. Then, the adhesive sheet 302 and the Si substrate 100 are peeled off together. Thus, the transistors formed on the Si substrate 100 are detached from the Si substrate 100 along the modified layer 103 along with thin films made of a Si substrate material.

As described in the above embodiments, semiconductor elements formed on a Si substrate (base substrate) can be thus transferred onto a large-area glass substrate (transfer destination substrate) so that the semiconductor elements are distributed on the glass substrate.

Note that, in the present invention, there is a case where an adhesive is needed to transfer elements from a base substrate onto a transfer destination substrate depending on which type of transfer destination substrate is used. For example, elements can be bonded to a glass substrate, which has small warp, undulation, and surface roughness (Ra), via intermolecular force. Meanwhile, elements cannot be bonded to a plastic substrate, which has large warp, undulation, and surface roughness (Ra), via intermolecular force. Accordingly, in a case where the elements are transferred onto a plastic substrate, the elements need to be bonded to the plastic substrate with the use of an adhesive or the like. In such a case, an adhesive may be applied in advance only to portions to which the elements are to be attached in the case of a flat transfer destination substrate. Alternatively, in the case of a transfer destination substrate on which an island pattern of projections is formed, an adhesive may be applied only to top surfaces of the projections.

The present invention can also be realized by the following arrangements.

In the method of the present invention for manufacturing a semiconductor device, it is preferable that said some of the plurality of elements that have been transferred form an island pattern in a matrix on the second substrate.

According to this method, the elements that have been transferred onto the transfer destination substrate can be distributed in a matrix. This makes it possible to produce a high-performance semiconductor device at low cost.

In the method of the present invention for manufacturing a semiconductor device, it is preferable that a pitch of the island pattern formed on the second substrate is an integer multiple of a pitch of the island pattern formed on the first substrate.

According to the method, the pitch of the island pattern formed on the second substrate which is a transfer destination is an integer multiple of a pitch of the island pattern formed on the first substrate. Accordingly, even in a case where the pitch of the island pattern of the second substrate is changed from an integer multiple of the pitch of the island pattern of the first substrate to another integer multiple of the pitch of the island pattern of the first substrate (e.g., a case where the pitch of the island pattern of the second substrate is changed from a pitch twice the pitch of the island pattern of the first substrate to a pitch four times the pitch of the island pattern of the first substrate), it is unnecessary to change layout of the island pattern of the first substrate and it is only necessary to change layout of the second substrate. That is, objects to be transferred can be sufficiently distributed on corresponding regions of the second substrate.

In the method of the present invention for manufacturing a semiconductor device, it is preferable that the laser irradiation is performed with respect to predetermined regions of the base substrate while a laser light source is being passed over a substrate surface or while a stage on which the substrate is mounted is being passed over the substrate surface.

According to the method, the entire predetermined regions, each of which has a peeled area larger than a spot diameter of the laser, can be irradiated with the laser. This allows a modified layer for detachment to be formed on the entire predetermined regions. Thus, the separation along the modified layer can be more surely carried out.

The method of the present invention for manufacturing a semiconductor device preferably further includes the step of forming a fragile layer inside the base substrate, the laser irradiation is performed with respect to the fragile layer. The fragile layer can be formed by ion implantation or ion doping for introducing at least one of a hydrogen atom, a hydrogen molecule, a hydrogen ion, and a rare gas ion into the first substrate.

The fragile layer is a layer that is weaker than other parts of the base substrate. According to the method, the modified region obtained by the laser irradiation is formed along the fragile layer inside the base substrate. This makes the separation along the modified region easier.

The method of the present invention for manufacturing a semiconductor device preferably further includes the step of forming a light absorbing layer inside the base substrate the laser irradiation is performed with respect to the light absorbing layer. The light absorbing layer can be formed by ion implantation or ion doping for introducing any one of boron, phosphorus, arsenic, gallium, indium, titanium, palladium, carbon, silicon, antimony, zinc, tellurium, and cadmium into the base substrate.

The light absorbing layer is a layer in which more levels for carrier transition exist and which absorbs more light as compared with the other parts of the base substrate. According to the method, the light absorbing layer allows more light to be absorbed inside the base substrate during the laser irradiation. Accordingly, a multiphoton absorption phenomenon becomes more likely to occur. This makes the modification caused by the laser irradiation more intense. As a result, the separation becomes easier.

In the method of the present invention for manufacturing a semiconductor device, it is preferable that the laser irradiation is performed in a state in which a temperature of the base substrate is increased to a room temperature or higher.

According to the method, the temperature of the base substrate is increased to a room temperature or higher. This narrows a band gap, thereby allowing more light to be absorbed. Accordingly, a multiphoton absorption phenomenon becomes more likely to occur. Consequently, a weaker modified region can be formed.

In the method of the present invention for manufacturing a semiconductor device, it is preferable that the laser is any one of Nd:YAG laser, Nd:YVO4 laser, Nd:YLF laser, and titanium-sapphire laser.

According to the method, each of the lasers exemplified above has a long wavelength, and therefore passes through even a surface of a substrate which does not transmit UV light, and is focused inside the substrate due to a multiphoton absorption phenomenon. Accordingly, a weak modified region can be formed.

In the method of the present invention for manufacturing a semiconductor device, it is preferable that said some of the plurality of elements are separated from the first substrate by applying a mechanical force to a side surface of the base substrate.

According to the method, the external mechanical force makes the separation along the modified region inside the base substrate easier.

In the method of the present invention for manufacturing a semiconductor device, the plurality of elements are semiconductor thin films, semiconductor elements, or parts of respective semiconductor elements.

According to the method, parts of respective semiconductor elements are transferred as elements. That is, half-completed semiconductor elements can be selectively transferred onto the transfer destination substrate. Accordingly, it is possible that only microfabrication processes which are difficult to perform on a large-area substrate be carried out on a small-area substrate and that processes which do not require high accuracy be carried out on the large-area substrate after the elements (the parts of the respective semiconductor elements) are transferred. In a case where no microfabrication is necessary, all the processes can be carried out collectively on the large-area substrate after the semiconductor thin films are transferred as elements onto the large-area substrate. In a case where microfabrication is necessary in all of the processes, minute semiconductor elements that have been completed as elements on the small-area substrate can be transferred onto the large-area substrate. That is, the semiconductor elements can be processed in a way suitable for required processing accuracy. This can reduce a production cost and increase throughput.

The semiconductor elements are light-emitting elements, liquid crystal control elements, photoelectric conversion elements, piezoelectric elements, thin-film transistor elements, thin-film diode elements, resistive elements, switching elements, micro magnetic elements, or micro optical elements.

The elements may be monocrystalline Si thin films or semiconductor elements which contain monocrystalline Si.

According to the method, monocrystalline Si thin films or semiconductor elements containing monocrystalline Si can be selectively transferred onto the second substrate. The semiconductor elements containing monocrystalline Si are, for example, transistors.

In the method of the present invention for manufacturing a semiconductor device, it is preferable that the laser irradiation is performed under conditions that a peak power density is $1 \times 10^8$ W/cm$^2$ or more and a pulse width is 1 µs or less. More preferably, the laser irradiation is performed under conditions that the peak power density falls in a range from $1 \times 10^{11}$ W/cm$^2$ to $1 \times 10^{12}$ W/cm$^2$ and the pulse width falls in a range from 1 ns to 200 ns.

According to the method, a weak modified layer such as a modified layer having a crack or a modified layer having a melting-treated region can be stably formed inside the base substrate.

Further, it is preferable that the laser irradiation is performed under conditions that a peak power density is $1 \times 10^8$ W/cm$^2$ or more and a pulse width is 1 ns or less. This allows a modified layer which has a refractive index change region to be stably formed.

In the method of the present invention for manufacturing a semiconductor device, it is preferable that the base substrate is any one of a silicon substrate, SOI substrate, a sapphire substrate, a GaN substrate, and a GaAs substrate. According to the method, semiconductor elements of various kinds such as transistors, power generation elements, or light-emitting elements can be distributed on the second substrate.

In the method of the present invention for manufacturing a semiconductor device, it is preferable that the second substrate is constituted by any of a glass substrate, a plastic substrate, and a film bonded to a supporting substrate. According to the method, the elements can be distributed even on a soft substrate.

The semiconductor device of the present invention is preferably arranged such that the elements are monocrystalline Si thin films, semiconductor elements which contain monocrystalline Si, or parts of the respective semiconductor elements.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention is applied to a semiconductor device manufacturing method including transferring minute semiconductor elements formed on a small substrate onto a large-area substrate so that the elements are distributed on the large-area substrate.

REFERENCE SIGNS LIST

100: Si substrate (base substrate, first substrate)
100'': Island (projection)
103: Modified layer
104: Fragile layer
105: Light absorbing layer
108: Gate electrode
113: Source/drain electrode
200: Glass substrate (transfer destination substrate, second substrate)
200'': Island (projection)
301: Blade
302: Adhesive sheet

The invention claimed is:
1. A semiconductor device comprising:
an insulating substrate; and
elements provided on the insulating substrate,
the insulating substrate having projections provided at predetermined intervals,
the elements being formed directly on the projections by transferring the elements onto the insulating substrate in such a manner that top surfaces of the elements are in contact with the projections and rear surfaces of the elements face away from the projections by a multiphoton absorption phenomenon caused within a base substrate when the base substrate is selectively irradiated with a laser having a wavelength that causes multiphoton absorption.

* * * * *